(12) United States Patent
Nakajima et al.

(10) Patent No.: US 7,291,506 B2
(45) Date of Patent: Nov. 6, 2007

(54) MAGNETIC MEMORY DEVICE AND METHOD OF MANUFACTURING THE SAME

(75) Inventors: Kentaro Nakajima, Tokyo (JP); Minoru Amano, Kawasaki (JP); Tomomasa Ueda, Yokohama (JP); Shigeki Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 11/171,323

(22) Filed: Jul. 1, 2005

(65) Prior Publication Data
US 2005/0254289 A1    Nov. 17, 2005

Related U.S. Application Data

(62) Division of application No. 10/702,574, filed on Nov. 7, 2003, now Pat. No. 6,965,138.

(30) Foreign Application Priority Data
Jul. 23, 2003   (JP) ............................. 2003-200413

(51) Int. Cl.
*H01L 21/00* (2006.01)
(52) U.S. Cl. ................. 438/3; 438/238; 438/381; 438/712; 257/E21; 257/91; 257/218; 257/665
(58) Field of Classification Search .............. 438/3, 438/238, 381, 513, 692, 701, 706, 728, 732, 438/723, 743, 756, 712, 8, 689
See application file for complete search history.

(56) References Cited

U.S. PATENT DOCUMENTS

| | | | |
|---|---|---|---|
| 5,946,228 A | 8/1999 | Abraham et al. | ........... 365/173 |
| 6,072,718 A | 6/2000 | Abraham et al. | ........... 365/173 |
| 6,473,336 B1 | 10/2002 | Nakajima et al. | ........... 365/171 |
| 6,737,691 B2 | 5/2004 | Asao | ........................... 257/295 |
| 6,829,162 B2* | 12/2004 | Hosotani | ..................... 365/173 |
| 6,965,138 B2* | 11/2005 | Nakajima et al. | ........... 257/295 |
| 2004/0100832 A1 | 5/2004 | Nakajima | |

FOREIGN PATENT DOCUMENTS

| | | |
|---|---|---|
| JP | 2002-334881 | 11/2002 |
| JP | 2003-110162 | 4/2003 |
| JP | 2003-174215 | 6/2003 |
| KR | 2003-0048351 | 6/2003 |

* cited by examiner

*Primary Examiner*—David Nhu
(74) *Attorney, Agent, or Firm*—Oblon, Spivak, McClelland, Maier & Neustadt, P.C.

(57) ABSTRACT

A method of manufacturing a magnetic memory device includes forming an insulation layer on a substrate, forming a lower electrode on the insulation layer, forming a magneto-resistive film on an upper surface of the lower electrode, the magneto-resistive film including an insulation barrier layer and a plurality of magnetic films stacked on both sides of the insulation barrier layer, stacking a mask layer on the magneto-resistive film, performing ion etching on the magneto-resistive film, using the mask layer as a mask, thereby forming a magneto-resistive element, forming an insulation film on upper surfaces of the mask, the magneto-resistive element and the lower electrode, and etching the insulation film with an ion beam such that a side surface of the magneto-resistive element is exposed.

19 Claims, 12 Drawing Sheets

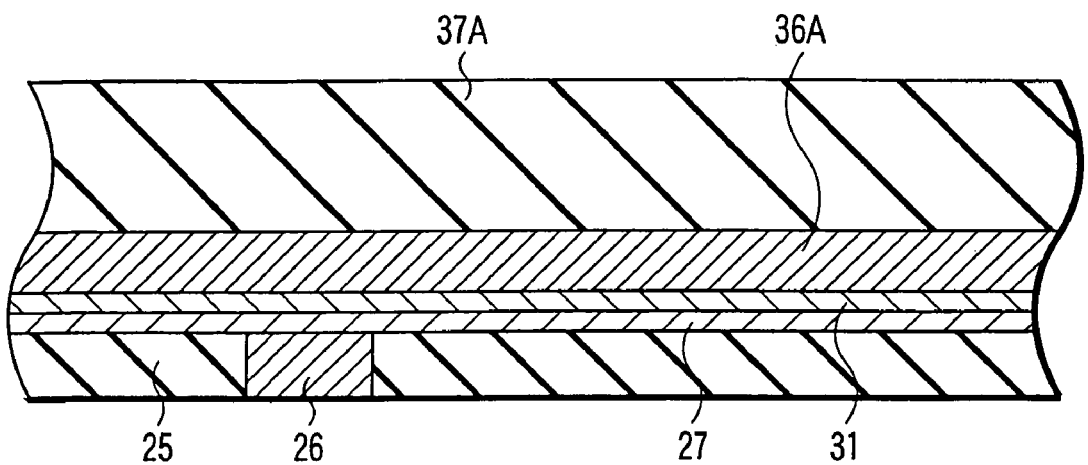
F I G. 3A
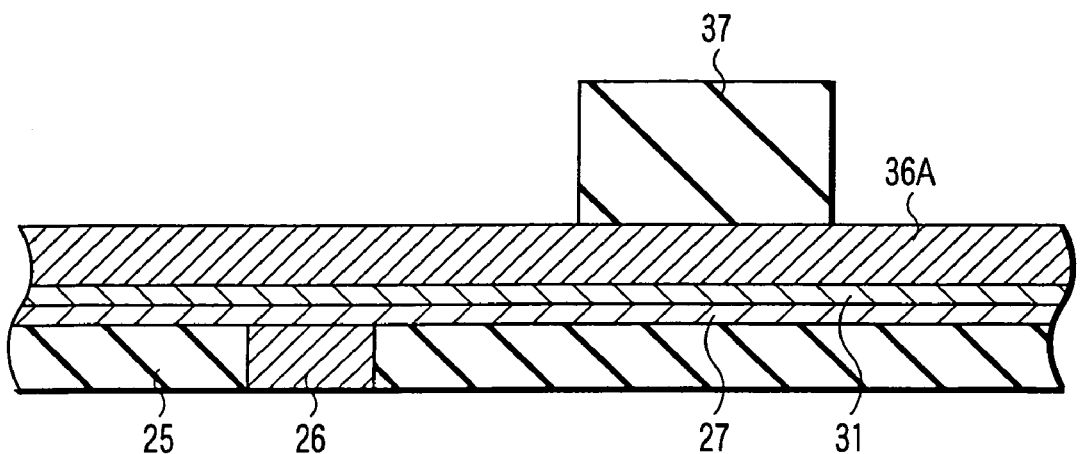
F I G. 3B
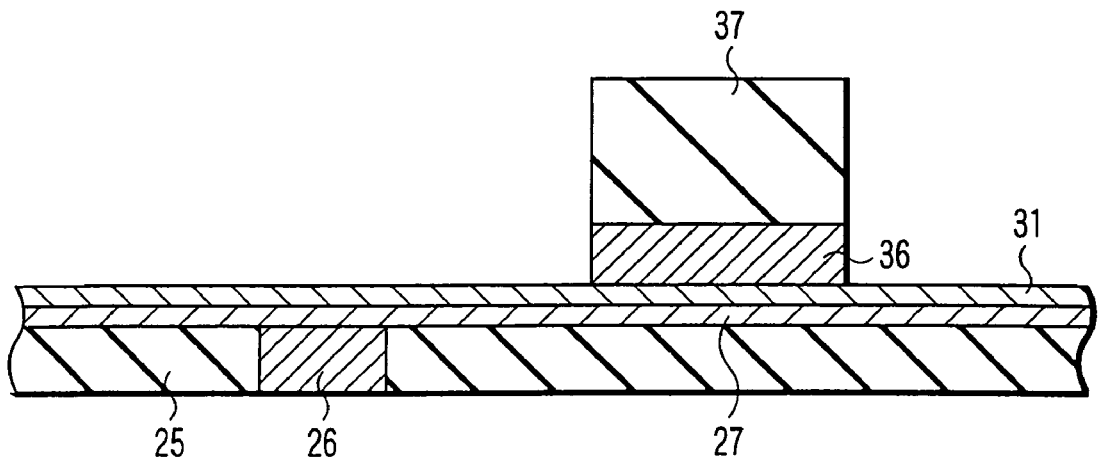
F I G. 3C

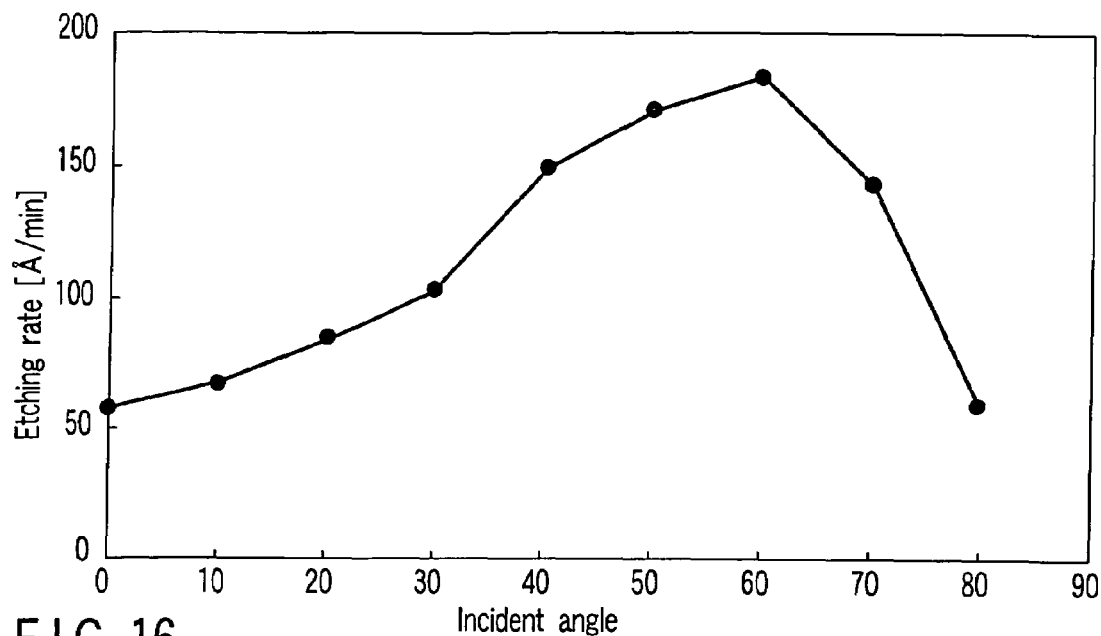
F I G. 16
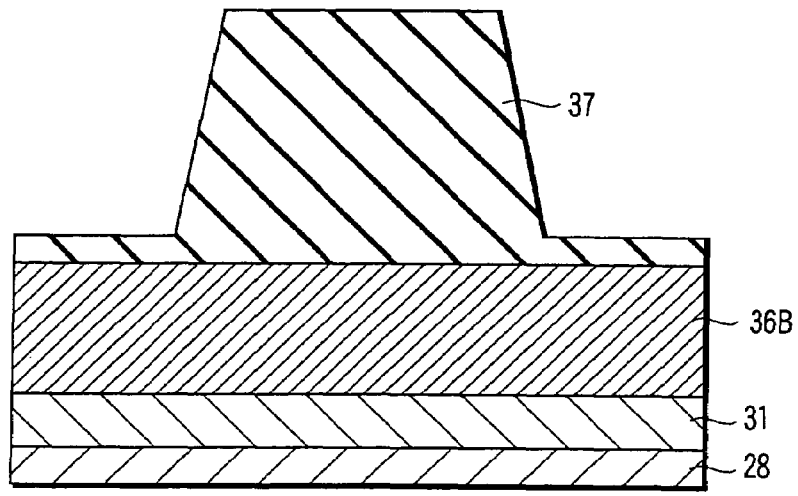
F I G. 17A
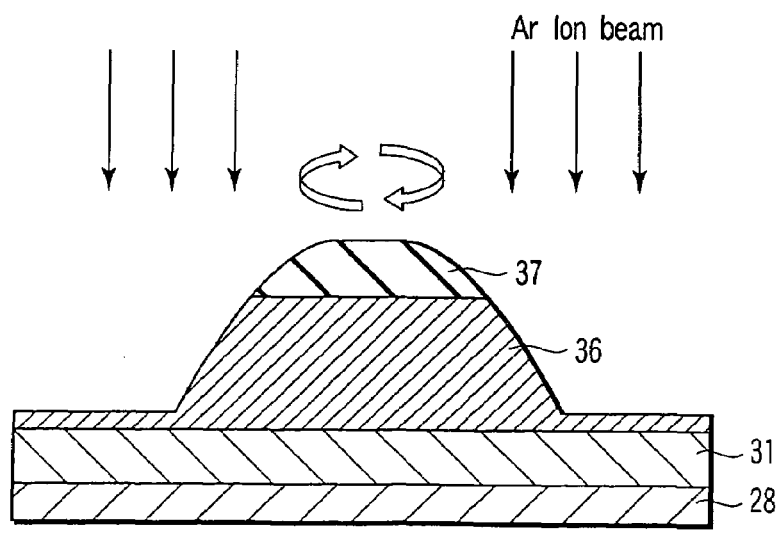
F I G. 17B

MAGNETIC MEMORY DEVICE AND METHOD OF MANUFACTURING THE SAME

CROSS-REFERENCE TO RELATED APPLICATIONS

This application is a divisional application of U.S. application Ser. No. 10/702,574, filed Nov. 7, 2003, U.S. Pat. No. 6,965,138 is based upon and claims the benefit of priority from the prior Japanese Patent Application No. 2003-200413, filed Jul. 23, 2003, the entire contents of which are incorporated herein by reference.

BACKGROUND OF THE INVENTION

1. Field of the Invention

The present invention relates to a magnetic memory device of a magnetic random access memory (hereinafter referred to as "MRAM"), and more particularly to a magnetic memory device using a magneto-resistive element and a method of manufacturing the magnetic memory device.

2. Description of the Related Art

The MRAM is a generic term of a nonvolatile solid-state memory which can randomly rewrite, store and read information as an information recording medium, making use of a variation in resistance value of a barrier layer due to a change in direction of magnetization of ferromagnetic layers. In general, a memory cell of the MRAM has a stacked structure of a plurality of ferromagnetic layers and the barrier layer. For example, a pin layer, which is a first ferromagnetic layer, a barrier layer which is an insulation layer, and a free layer, which is a second ferromagnetic layer, are stacked. The first and second ferromagnetic layers are configured to sandwich the barrier layer.

The memory cells are provided at intersections of sense lines and word lines. The sense lines and word lines are formed in cross stripes, and the intersections are arranged in a matrix. Each memory cell is disposed such that it is interposed between the associated sense line and word line.

Information is recorded such that binary information "1" and binary information "0" are made to correspond to two states, that is, a state in which the magnetization directions of the pin layer and free layer, which are structural components of the memory cell, are the same ("parallel") and a state in which the magnetization directions of the pin layer and free layer are opposite ("antiparallel"). The write operation of the information "1", for example, is performed such that the magnetization direction of the free layer of each memory cell is reversed by a magnetic field that is generated by letting a current flow in the word line so that the magnetization directions are the same ("parallel"). This memory cell is a nonvolatile memory which consumes no power, in principle, at an information retention time and the stored information is retained even if power to the memory cell is turned off.

The information reading operation is performed by detecting the resistance of the barrier layer having a resistance value due to a so-called magneto-resistive effect. This is a phenomenon in which the electric resistance of the barrier layer of the memory cell varies depending on the relative angle between the magnetization directions of the ferromagnetic pin layer and free layer of the memory cell, on the one hand, and a sense current direction, on the other hand, or depending on the relative angle between the magnetization directions of the pin layer and free layer.

Functional differences between the MRAM and a conventional dielectric-based charge-accumulation type semiconductor memory, such as a DRAM, are explained. First, the MRAM is a nonvolatile memory and is capable of rewriting data $10^{15}$ times or more. Second, the MRAM is capable of non-destructive read, and is also capable of decreasing a read cycle time since no refreshing operation is required. Third, compared to the charge-accumulation-type semiconductor memory, the MRAM has a higher resistance to radiation with respect to the storage of information.

It is expected that the integration density of the memory cells per unit area and the write/read time of the MRAM are approximately equal to those of the DRAM. Thus, by virtue of the remarkable feature of the complete nonvolatility, it is expected that MRAMs would be applied to external memory devices for mobile equipment, hybrid LSIs, and main memories of personal computers.

A type of MRAM, which is currently under investigation for practical use, uses a magneto-tunneling-junction element (hereinafter referred to as "MTJ element") in the memory cell (see, e.g. U.S. Pat. No. 5,946,228 and U.S. Pat. No. 6,072,718).

The MTJ element mainly comprises three layers, i.e. a ferromagnetic layer/an insulating layer (tunneling barrier layer)/a ferromagnetic layer. A current flows through the insulating layer by a tunneling effect. The tunneling resistance value of the insulating layer varies in proportion to a cosine of the relative angle of magnetization directions of both ferromagnetic layers. When the magnetization directions of both ferromagnetic layers are antiparallel, the tunneling resistance takes a maximum value. For example, in the case of NiFe/Co/Al$_2$O$_3$/Co/NiFe tunneling junction, a rate of change in resistance value, which exceeds 25%, is found in a low magnetic field of 50 Oe or less.

In a micro-manufacturing process for forming an MTJ element, a combinational process using photo-lithography and Ar ion etching is generally used.

Additionally, in the field of semiconductors, dry etching processes using chemical reactions, such as chemical dry etching (CDE) and reactive ion etching (RIE) are used.

In addition, detailed descriptions of the conventional MRAM structures appear in U.S. Pat. No. 5,946,228 and U.S. Pat. No. 6,072,718.

As has been described above, in order to form the MTJ element, the stacked structure of the magnetic layers and barrier layer for forming the MTJ element has to be subjected to the micro-manufacturing process using ion etching. An ion etching method used in the micro-manufacturing process of the MTJ element is a physical sputtering method. However, if a micro-manufacturing process using ion etching is performed, sputtered particles removed from the surface being processed are produced as a residual in the course of the etching process and is re-deposited to the side of the resist mask, the processed surface of the MTJ element, or the inside of the processing apparatus.

At present, in the etching of Si, SiO$_2$, etc. using chemical reactions such as chemical dry etching (CDE) or reactive ion etching (RIE), the material being etched is removed in a gas phase as a halide having a high vapor pressure. However, halides of 3d transition metals, such as Fe, Ni, Co and Cu, used in the formation of the MTJ element, have a low vapor pressure, and it is difficult to be processed in the ordinary semiconductor manufacturing process.

On the other hand, there is an idea that a mixture gas of carbon monoxide, ammonia, etc. is used and chemical etching is performed by forming an organic metal compound. In this method, however, the chemical reaction rate is insufficient, and the process inevitably involves physical sputtering using a reaction gas. Thus, this method has not yet been put to practical use.

However, according to the micro-manufacturing process using physical sputtering, the aforementioned residual film of processed material remains on the side surface of the processed part of the MTJ element. It has turned out that in some cases, the residual film has electrical conductivity, and it may short-circuit the insulating barrier film, leading to initial defects of the MRAM cell.

BRIEF SUMMARY OF THE INVENTION

According to an aspect of the invention, there is provided a magnetic memory device comprising: a substrate; and a wiring layer formed on the substrate, wherein the wiring layer includes a lower electrode, a magneto-resistive element formed on the lower electrode and configured to include an insulation barrier layer, at least one contact layer stacked on the magneto-resistive element, and an upper wiring connected to the contact layer, and a taper angle of a side surface of the magneto-resistive element including the insulation barrier layer, relative to a bottom surface of the magneto-resistive element, is about 60° or less.

According to another aspect of the present invention, there is provided a magnetic memory device comprising: a substrate; and a wiring layer formed on the substrate, wherein the wiring layer includes a lower electrode, a magneto-resistive element formed on the lower electrode and configured to include an insulation barrier layer, at least one contact layer stacked on the magneto-resistive element, and an upper wiring connected to the contact layer, and the magneto-resistive element has an inclined side surface which is cleaned by ion beam etching after the magneto-resistive element is formed by ion beam etching.

According to still another aspect of the present invention, there is provided a method of manufacturing a magnetic memory device, comprising: forming an insulation layer on a substrate; forming a lower electrode on the insulation layer; forming a magneto-resistive film on an upper surface of the lower electrode, the magneto-resistive film including an insulation barrier layer and a plurality of magnetic films stacked on both sides of the insulation barrier layer; stacking a mask layer on the magneto-resistive film; performing ion etching on the magneto-resistive film, using the mask layer as a mask, thereby forming a magneto-resistive element; forming an insulation film on upper surfaces of the mask, the magneto-resistive element and the lower electrode; and etching the insulation film with an ion beam such that a side surface of the magneto-resistive element is exposed.

BRIEF DESCRIPTION OF THE SEVERAL VIEWS OF THE DRAWING

FIG. 3A is a cross-sectional view illustrating in detail a step of forming the MTJ element in the magnetic memory device shown in FIGS. 1 and 2;

FIG. 3B is a cross-sectional view illustrating in detail a step of forming the MTJ element in the magnetic memory device shown in FIGS. 1 and 2, following the step of FIG. 3A;

FIG. 3C is a cross-sectional view illustrating in detail a step of forming the MTJ element in the magnetic memory device shown in FIGS. 1 and 2, following the step of FIG. 3B;

FIG. 16 is a graph plotting a variation in etching rate of insulation material, relative to the incidence angle (θ) of the ion beam;

FIG. 17A is a cross-sectional view illustrating a step of forming an MTJ element in a magnetic memory device according to a third embodiment of the present invention;

FIG. 17B is a cross-sectional view illustrating in detail a step of forming the MTJ element in the magnetic memory device, following the step of FIG. 17A;

DETAILED DESCRIPTION OF THE INVENTION

Figure 1:
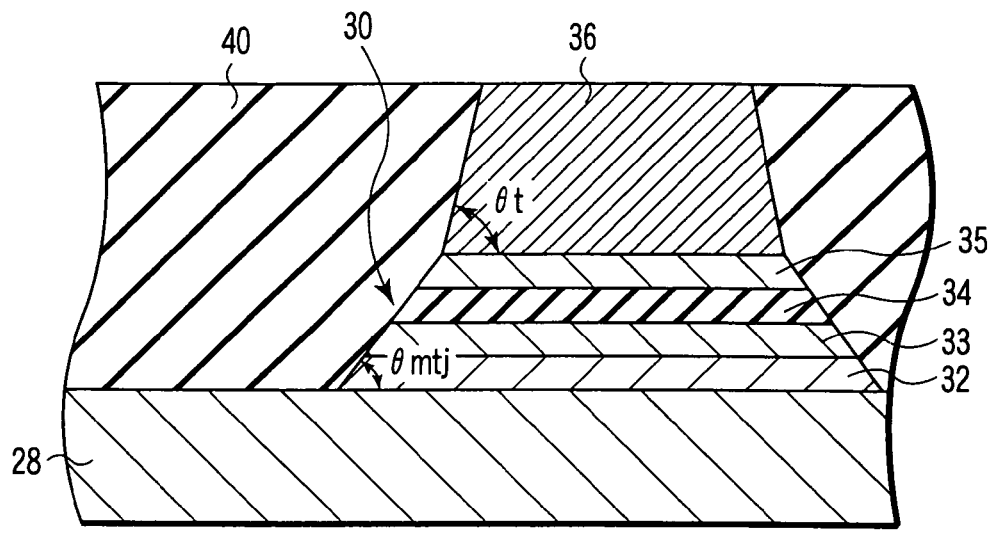
FIG. 1 is a cross-sectional view showing the structure of wiring layers in which an MTJ element of a magnetic memory device according to a first embodiment of the present invention is formed.

A first embodiment of the present invention will now be described with reference to the accompanying drawings. In the description below of the first embodiment, the same or similar structural parts are denoted by like reference numerals and a detailed description is omitted to avoid overlapping description.

FIG. 1 is a cross-sectional view of an MTJ element 30 formed as a magneto-resistive element according to an embodiment of the invention. In FIG. 1, the MTJ element 30 is formed on a lower electrode 28. A mask (hereinafter referred to as "hard mask") 36 is formed on the MTJ element 30. An interlayer insulation film 40 is integrally formed to cover the entirety of the lower electrode 28, MTJ element 30 and hard mask 36. The upper surface of the hard mask 36 is flush with the upper surface of the interlayer insulation film 40 and is exposed from the interlayer insulation film 40.

The MTJ element 30 has a four-layer structure. The MTJ element 30 comprises an antiferromagnetic layer 32, a first ferromagnetic layer 33, an insulation barrier layer 34 and a second ferromagnetic layer 35, which are formed in the named order over the lower electrode 28. The first ferromagnetic layer 33 is called a pin layer, and the second ferromagnetic layer 35 is called a free layer. In this embodiment, the MTJ element 30 has a four-layer structure, but the number of layers is not limited to four. In the practical level, various modifications can be made without departing from the spirit of the invention.

The angle of a side surface of the magnetic layers of the MTJ element 30, which include the insulation barrier layer 34, is referred to as a taper angle θmtj, and the angle of a side surface of the hard mask 36 is referred to as a taper angle θt. In FIG. 1, these angles are defined as the taper angle θmtj to the surface of the lower electrode 28, and the taper angle θt to the surface of the MTJ element 30. As will be described later, the surface of the lower electrode 28 is parallel to the surface of the substrate 11 shown in FIG. 2. Therefore, these angles may be defined as angles to a normal line that is vertical to, e.g. the surface of the substrate 11. In the embodiment of FIG. 1, the taper angle θt is set to be greater than the taper angle θmtj.

The hard mask 36 with the taper angle θt is formed by etching such as RIE. The MTJ element 30 is formed by performing ion milling, that is, ion etching using, e.g. Ar ions, using the hard mask 36 with taper angle θt as a mask.

As described above, the hard mask 36 is formed to have the taper angle θt, and the MTJ element 30 is formed to have the taper angle θmtj that is smaller than the taper angle θt.

Figure 2:
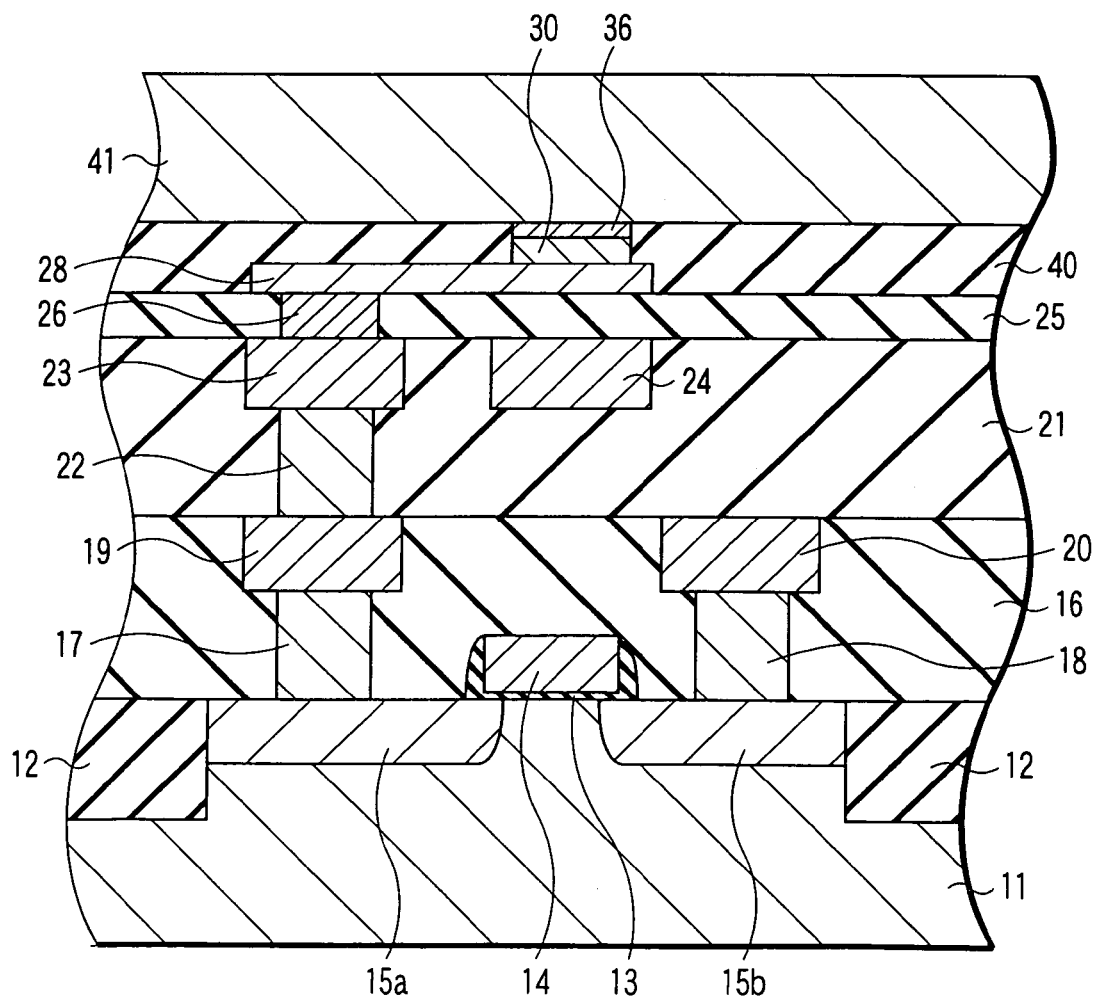
FIG. 2 is a cross-sectional view showing the structure of the magnetic memory device according to the first embodiment of the invention.

The structure of the embodiment, wherein a magnetic memory device having a wiring layer including the above-described MTJ element 30 is formed on the substrate, is described along with the manufacturing process thereof with reference to a cross-sectional view of FIG. 2.

In FIG. 2, a plurality of device isolation insulating films 12 are formed in a surface region of a semiconductor substrate 11. Source/drain regions 15a, 15b are formed by, e.g. diffusion of impurities, in a device formation region formed between the device isolation insulating films 12. A gate insulation film 13 and a gate electrode 14 are formed on that part of the semiconductor substrate 11, which lies between the source/drain regions 15a, 15b, thereby forming an MOS transistor. As is described later, the gate electrode 14 is used as a word line for reading information stored in the MTJ element 30.

Then, a first interlayer insulation film 16 is formed to cover the semiconductor substrate 11 on which the gate insulation film 13 and gate electrode 14 are formed. Two contact plugs 17 and 18 for contact with the upper surfaces of the source/drain regions 15a, 15b are formed in the first interlayer insulation film 16. The contact plug 17 is connected to the upper surface of one of the source/drain regions, 15a. An upper part of the contact plug 17 is connected to a wiring 19.

The contact plug 18 is connected to the upper surface of the other source/drain region 15b. An upper part of the contact plug 18 is connected to a wiring 20, which is a power supply line, i.e. a source line. The contact plug 17 and wiring 19 can be formed at a time by deposition of copper by means of, e.g. a dual damascene process. The contact plug 18 and wiring 20 can be formed similarly. After these conductive parts are formed, the surfaces of the first interlayer insulation film 16 and wirings 19 and 20 are polished by CMP and flattened.

Next, a second interlayer insulation film 21 is formed over the first interlayer insulation film 16. A via plug 22 is formed in the second interlayer insulation film 21 so as to contact the upper surface of the wiring 19 exposed by CMP. An upper part of the via plug 22 is connected to a wiring 23. In addition, in the second interlayer insulation film 21, a wiring 24 serving as a word line for information writing (to be described later) is formed adjacent to the wiring 23. The via plug 22 and wiring 23 are also formed by a dual damascene process. On the other hand, the wiring 24 can be formed by a single damascene process.

The second interlayer insulation film 21 and wirings 23 and 24 are polished by CMP, and then an interlayer insulation film 25 is formed on the second interlayer insulation film 21 including the wirings 23 and 24. A via plug 26, which penetrates the interlayer insulation film 25, is formed by a single damascene process and CMP such that the via plug 26 is connected to the upper surface of the wiring 23 exposed on the surface of the interlayer insulation film 21 by CMP.

Thereafter, a wiring 28, which is formed as the lower electrode 28 shown in FIG. 1, is formed on the third interlayer insulation film 25 such that the wiring 28 contacts the upper part of the via plug 26 exposed by CMP. The MTJ element 30 and hard mask 36 are successively provided on the upper surface of the lower electrode 28. Since this structure has been described with reference to FIG. 1, a description thereof is omitted here.

A fourth interlayer insulation film 40 is formed so as to cover the entirety of the lower electrode 28, MTJ element 30 and hard mask 36. After the fourth interlayer insulation film 40 is polished by CMP, a wiring 41 is formed on the interlayer insulation film 40. The wiring 41 is connected to the hard mask 36 of MTJ element 30 and used as a sense line, i.e. a bit line.

As has been described with reference to FIG. 1, the hard mask 36 interposed between the MTJ element 30 and wiring 41 is formed of a single material as a single-layer structure. Alternatively, a hard mask comprising a plurality of layers formed of a plurality of materials may be used.

As regards the above-described magnetic memory device, the manufacturing process, up to the provision of plural wiring layers successively formed using the interlayer insulation films 16, 21, 25 and 40 on the semiconductor substrate 11, is conventionally known in the art. A further description of the structure and the associated manufacturing process may be omitted here.

As is described later, a MOS transistor comprising the source/drain regions 15a, 15b, gate insulation film 13 and gate electrode 14 is used as a switching element which is operated at the time of reading information stored in the MTJ element 30.

Detailed structures of the lower electrode 28 and MTJ element 30 and a manufacturing process thereof are described later. As mentioned above, the wiring 24 is a word line used in combination with the bit line 41 at the time of writing information. In order to efficiently perform the write operation, the wiring 24 is provided immediately below the MTJ element 30 via the relatively thin interlayer insulation film 25.

A read operation and a write operation of the magnetic memory device formed as described above will now be explained in detail. The magnitude of resistance in the MTJ element 30 varies depending on the relative directions of spin of the two ferromagnetic layers, i.e. the free layer and pin layer, in the above-described MTJ element 30. Accordingly, data write is effected by reversing the direction of spin of the free layer.

The wiring 41 for the bit line and the wiring 24 for the word line are formed to intersect at right angles at a position corresponding to the MTJ element 30. At the time of data write, current is let to flow to both wirings 41 and 24. Then, the direction of spin of the free layer, which is one of the ferromagnetic layers in the MTJ element 30, changes due to a magnetic field produced by DC current flowing in the wirings 41 and 24. The resistance value of the insulation barrier layer in the MTJ element 30 varies depending on this direction of spin.

At the time of read-out, a read-out voltage is applied to the gate electrode 14 that is the word line for read-out, and the MOS transistor having this gate electrode 14 is turned on. As a result, a read-out current flowing in the wiring 41, which is the bit line, passes through the MTJ element 30 and flows through the lower electrode 28, via plug 26, wiring 23, via plug 22, wiring 19, contact plug 17, source/drain region 15a and power supply line 20 in succession.

Since the MOS transistor is turned on, current flows from one of the source/drain regions, 15a, to the other source/drain region 15b, and then flows to the wiring 20, which is the power supply line, via the contact plug 18.

In this case, when the resistance of the MTJ element 30 is high, the amount of sense current flowing between the wiring 41 and lower electrode 28 is small, and thus information "0", for example, is read by a sense circuit (not shown) connected to the bit line 41. When the resistance of the MTJ element 30 is low, the sense current is large and, for example, information "1" is read out.

At the time of write, no voltage is applied to the gate electrode 14 that is the word line for read-out, and thus the MOS transistor is in the off-state. The direction of spin in the MTJ element 30 is set by the direction of magnetic field produced by currents flowing in the wiring 41 (bit line) and wiring 24 (word line). For example, if the direction of spin in the MTJ element 30, which is the object of data write, agrees with the content of write data, the apparent state of the element 30 is unchanged after data write. If the direction is different, the direction of spin is changed in accordance with the data content. In short, the magnitude of the resistance value in each MTJ element is set in accordance with the data content.

A manufacturing process of the lower electrode 28 and MTJ element 30 according to the present embodiment will now be described in detail with reference to FIG. 3A through FIG. 5C.

In FIG. 3A, the upper surfaces of the interlayer insulation film 25 and via plug 26 are polished by CMP. On the polished surfaces, an electrically conductive wiring film 27 of copper, etc., a magneto-resistive film 31, a hard mask film 36A and another hard mask film 37A are formed in the named order.

The magneto-resistive film 31 has a multilayer structure for forming the MTJ element shown in FIGS. 1 and 2. That is, the magneto-resistive film 31 includes the antiferromagnetic layer 32, ferromagnetic layer 33, insulation barrier layer 34 and ferromagnetic layer 35, which are successively formed on the wiring film 27 that is deposited in order to form the wiring layer 28 shown in FIG. 1. In order to form the hard mask film 36A on the magneto-resistive film 31, Ta (tantalum) is used as a material. The hard mask film 36A is formed by sputtering to a thickness of 150 nm.

The hard mask film 37A is formed on the hard mask film 36A. Silicon dioxide ($SiO_2$) is used as material of the hard mask film 37A. The hard mask film 37A is formed by sputtering to a thickness of 100 nm. This state is shown in FIG. 3A.

A resist film (not shown) is deposited on the upper surface of the upper hard mask film 37A, and the hard mask film 37A is patterned to form a hard mask 37, as shown in FIG. 3B. The resist film is patterned by exposure, thereby to form a pattern corresponding to the hard mask 37. In this embodiment, the patterning is performed by lithography using an exposing apparatus which employs an excimer laser.

If the resist is patterned on the hard mask film 37A, the hard mask film 37A is etched by RIE using $CHF_3$, under conditions that the chamber pressure is 1 Pa and the radio-frequency power is 150 W. After the hard mask film 37A is selectively etched and the hard mask 37 is formed, the resist pattern lying on the hard mask 37 is removed by ashing using $O_2$. In addition, ultrasonic washing using acetone is successively performed. Thus, the hard mask 37 is formed, as shown in FIG. 3B.

Subsequently, using the hard mask 37, the hard mask film 36A is etched by RIE using $CHF_3$, $CF_4$ and $O_2$, under conditions that the chamber pressure is 5 Pa and the radio-frequency power is 150 W. Alternatively, the hard mask film 36A may be etched by RIE using $Cl_2$. As a result, as shown in FIG. 3C, the pattern of the upper hard mask 37 is transferred to the hard mask film 36A, and the hard mask 36 is formed.

Figure 4A:
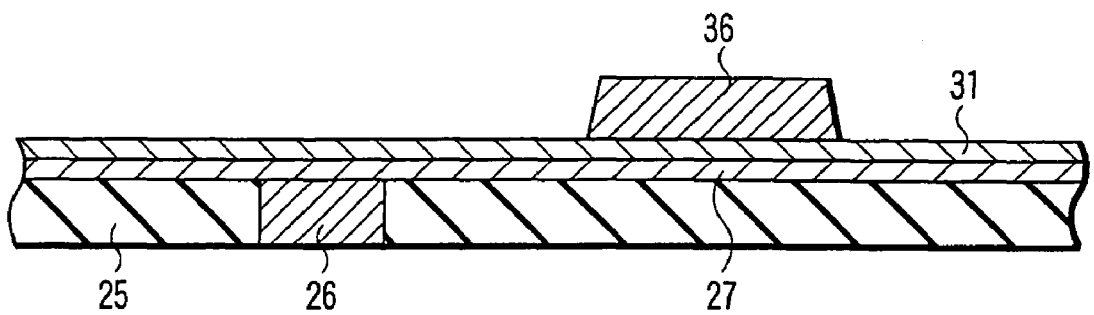
FIG. 4A is a cross-sectional view illustrating in detail a step of forming the MTJ element in the magnetic memory device, following the step of FIG. 3C.

Thereafter, the hard mask 37 on the hard mask 36 is etched away by RIE using, e.g. $CHF_3$, under conditions that the chamber pressure is 1 Pa and the radio-frequency power is 150 W. Thus, as shown in FIG. 4A, the hard mask 36 is formed on the magneto-resistive film 31.

Using the thus formed hard mask 36, the magneto-resistive film 31 is etched. By etching the magneto-resistive film 31, the magneto-resistive film 31 is separated into the shape of the hard mask 36 and patterned to have the shape of the MTJ element 30 having taper surfaces, as shown in FIG. 4B.

Figure 7:
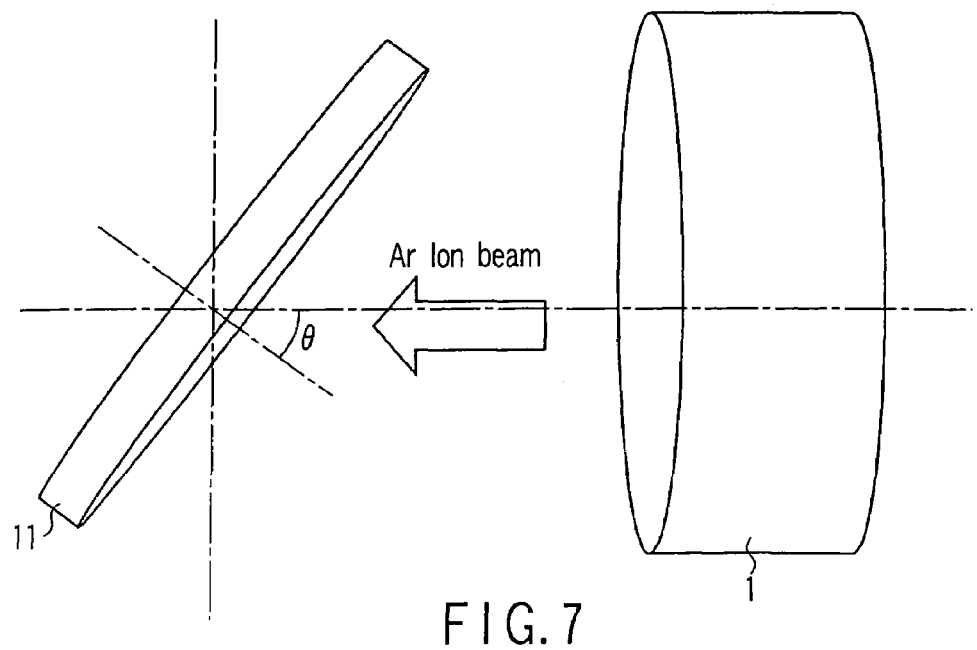
FIG. 7 is a schematic view showing the relationship between a beam source, on the one hand, which generates an Ar ion beam for use in the milling step illustrated in FIGS. 6A to 6C, and a substrate, on the other.

In this embodiment, ion etching for forming the MTJ element 30 is performed by an Ar ion etching process using the hard mask as a mask. The Ar ion etching is performed such that an Ar ion source 1, as shown in FIG. 7, for example, is used and the generated Ar ion beam is applied to a major surface of the semiconductor substrate 11 at an incidence angle θ to a normal line perpendicular to the major surface of the substrate 11. For example, the conditions for the Ar ion etching are set such that an ion acceleration voltage $V_B$=400 V, which is applied between the Ar ion source 1 and substrate 11, an ion beam current amount $I_B$=100 mA, and the angle θ of incidence to the substrate 11 is 30° or 45°.

Figure 4B:
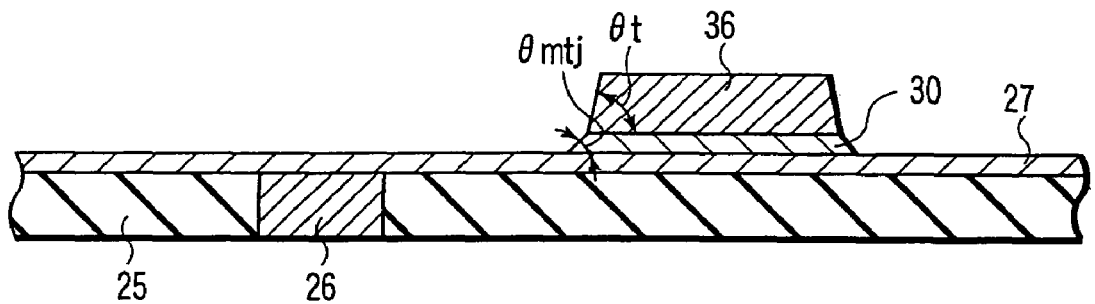
FIG. 4B is a cross-sectional view illustrating in detail a step of forming the MTJ element in the magnetic memory device, following the step of FIG. 4A.

As is shown in FIG. 4B, side surfaces of the hard mask 36 are etched by the Ar ion etching so that the hard mask 36 has a trapezoidal shape with an angle θt formed between the side surface and the bottom surface. Similarly, the MTJ element 30 has a trapezoidal shape with an angle θmtj. Details of this ion etching are described later.

Figure 4C:
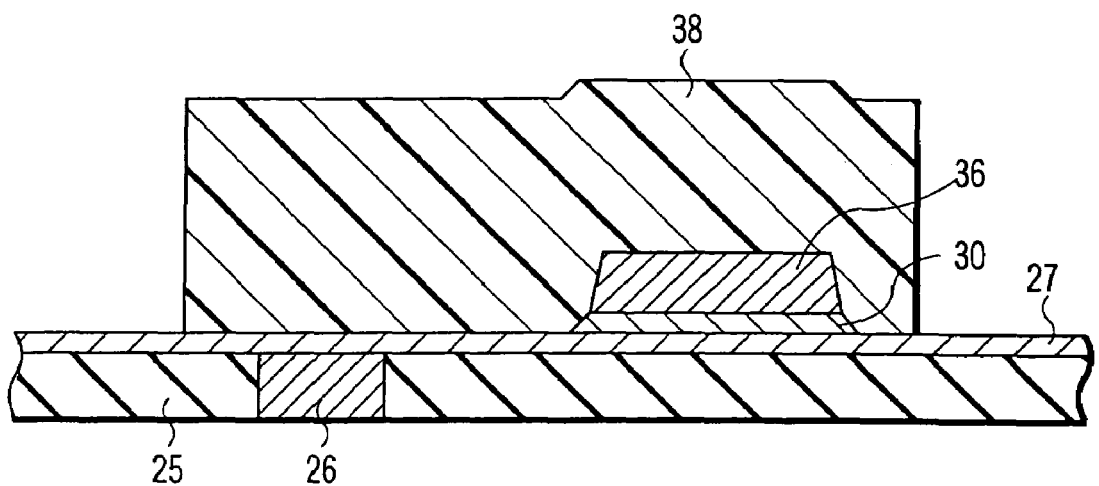
FIG. 4C is a cross-sectional view illustrating in detail a step of forming the MTJ element in the magnetic memory device, following the step of FIG. 4B.

As is shown in FIG. 4C, in order to form the wiring layer, a hard mask 38 is formed on the wiring film 27 so as to cover the hard mask 36 and MTJ element 30. For this purpose, an $SiO_2$ film, for instance, is formed as a hard mask film over the entire substrate 11 by sputtering to a thickness of 80 nm. Then, a resist film is deposited on the $SiO_2$ film. The resist film is patterned by photolithography, and a resist mask corresponding to the hard mask 28 is formed.

Using the resist mask, the $SiO_2$ film is patterned and thus the hard mask 38 is formed. In this patterning, the $SiO_2$ film is etched by RIE using $CHF_3$ under the condition that the chamber pressure is 1 Pa. Thus, the hard mask 38 having the shape shown in FIG. 4C is formed under the resist mask (not shown).

The resist mask is ashed using $O_2$, and thus removed. In addition, ultrasonic washing using acetone is successively performed. As a result, the hard mask 38 having the shape shown in FIG. 4C is formed.

Figure 5A:
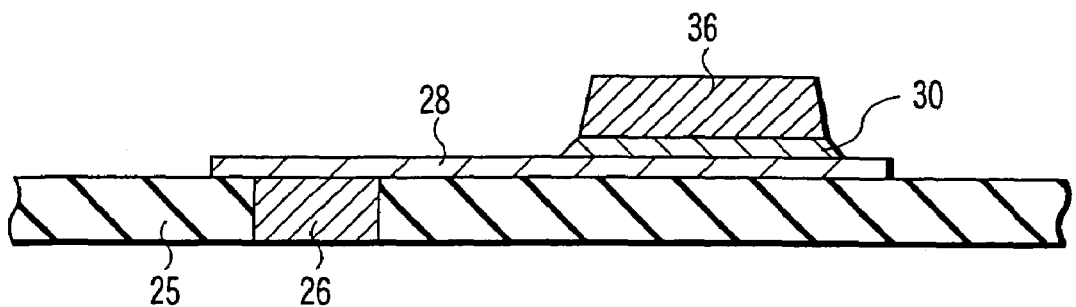
FIG. 5A is a cross-sectional view illustrating in detail a step of forming a wiring layer including the MTJ element in the magnetic memory device, following the step of FIG. 4C.

Subsequently, using the hard mask 38, the wiring film 27 is etched. This etching is effected by Ar ion etching under the conditions that the acceleration voltage $V_B$=400 V and the incidence angle θ=0°. As a result, the lower electrode layer 28 shown in FIG. 5A is formed.

Then, like the hard mask 37, the hard mask film 38 is etched away by RIE using, e.g. $CHF_3$, under conditions that the chamber pressure is 1 Pa and the radio-frequency power is 150 W. As a result, as shown in FIG. 5A, the MTJ element 30 and hard mask 36 are formed on the lower electrode layer 28 that is connected to the via plug 26.

Figure 5B:
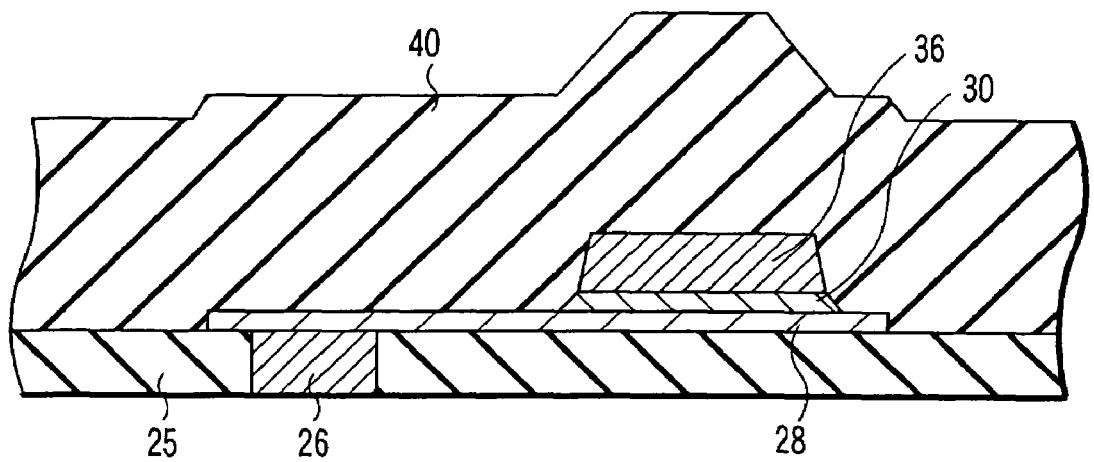
FIG. 5B is a cross-sectional view illustrating in detail a step of forming the wiring layer including the MTJ element in the magnetic memory device, following the step of FIG. 5A.

In a subsequent step shown in FIG. 5B, an interlayer insulation film 40 is formed by sputtering over the interlayer insulation film 25, wiring layer 28 that is the lower electrode, and hard mask 36. The conditions for forming the interlayer insulation film 40 are that sputter energy is supplied by a 150 W radio-frequency power in an atmosphere of Ar and $O_2$ at 1 mTorr, the thickness of the interlayer insulation film 40 is set at 600 nm. As a result, the interlayer insulation film 40 having a stepped shape, as shown in FIG. 5B, is obtained. That is, the interlayer insulation film 40 has a projecting portion corresponding in position to the MTJ element 30 and hard mask 36.

Subsequently, the entire substrate, on which the interlayer insulation film 40 is formed, is washed by an ultrasonic washing process using acetone.

Following the above, a resist film (not shown) is coated over the interlayer insulation film 40 having the stepped surface portion. In this embodiment, a resist coat film having a thickness of about 600 nm and having a flat surface is formed. Then, the entire structure is hard-baked at 220° C. for 30 minutes in an oven with an $N_2$ atmosphere.

The hard-baked resist coat film is etched by RIE. In the RIE, $CF_4$, for instance, is used, and the chamber pressure is set at 5 Pa. As a result, the resist coat film and interlayer insulation film 40 are etched in parallel to the surface of the substrate at substantially equal etching rates. Finally, as shown in FIG. 5C, the surface of the interlayer insulation film 40 is etched in a substantially flat shape down to the horizontal upper surface of the hard mask 36.

Figure 5C:
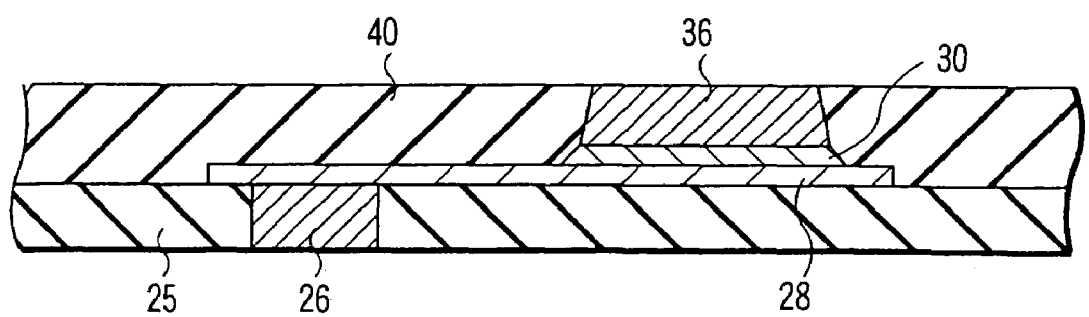
FIG. 5C is a cross-sectional view illustrating in detail a step of forming the wiring layer including the MTJ element in the magnetic memory device, following the step of FIG. 5B.

Then, as shown in FIG. 5C, the exposed surface of the hard mask 36 formed of Ta is subjected to Ar ion etching for contact cleaning. For example, the conditions for the Ar ion etching are set such that an ion acceleration voltage $V_B=400$ V, an ion beam current amount $I_B=250$ mA, the incidence angle $\theta=0°$, and the beam irradiation time=0.4 minute.

Thereafter, a metal film (not shown) for forming the sense line shown in FIG. 2 is formed on the cleaned hard mask 36 and interlayer insulation film 40. For example, Ta is used as the material of the metal film, and the metal film is formed by sputtering to a thickness of 10 nm. Note that Cu may be used for Ta. In a case where Cu is used, the metal film is formed by sputtering to a thickness of 200 nm.

A resist film (not shown) with a predetermined thickness is deposited on the Ta film formed over the hard mask 36. After formation of the resist film, the resist film is exposed and a resist pattern is formed.

Further, using the resist pattern formed on the Ta film, the Ta film is patterned by Ar ion etching. The conditions for the Ar ion etching are, for example, that the acceleration voltage $V_B=400$ V and the incidence angle $\theta=30°$. Thereby, the Ta film is etched to have a shape corresponding to the resist pattern. As a result, the Ta film becomes an upper wiring of a predetermined shape, that is, the sense line 41.

The resist pattern used for the etching of the Ta film is removed by ashing using $O_2$. Further, ultrasonic washing using acetone is performed in succession.

In the above-described manner, a magnetic memory device having the cross-sectional structure shown in FIG. 2 is manufactured. Finally, the formed magnetic memory device is subjected to heat treatment in a magnetic field. The conditions for the heat treatment are that the heat treatment is formed in a vacuum state for one hour at 300° C. with a magnetic field intensity of 6.5 kOe.

The material of the hard mask 36 is not limited to Ta, and any material with electrical conductivity is usable. In the above embodiment, $SiO_2$ is used as material of the other hard mask 37 and hard mask 38. The material, however, is not limited to $SiO_2$. For example, AlOx, SiN, SiON, or organic glass may be used. However, since it is necessary to etch away the hard mask 37 after etching the hard mask 36, as shown in FIG. 3C and FIG. 4A, it is necessary to consider an etching selectivity ratio such that the hard mask 37 is removed easier than the hard mask 36. In the above-described embodiment, the thicknesses of the hard mask 36 and hard mask 37 are 150 nm and 100 nm, respectively. These thicknesses, however, can be set at other values. Similarly, the thicknesses of the hard mask 36, interlayer insulation film 40 and upper wiring 41 can be set at other values.

Moreover, the setting condition for RIE, the setting conditions for the acceleration voltage $V_B$ and ion current amount $I_B$ at the time of Ar ion etching, the setting condition for sputtering, the method of removing the resist pattern and the setting condition for heat treatment in the magnetic field are not limited to those in the embodiment and can be varied at the practical stage without departing from the spirit of the invention.

The above-described micro-manufacturing process of the MTJ element 30 is carried out by photolithograph by the exposing apparatus using the excimer laser and Ar ions. However, the photolithography by the exposing apparatus using the excimer laser may be replaced with photolithography using a contact aligner.

Figure 6A:
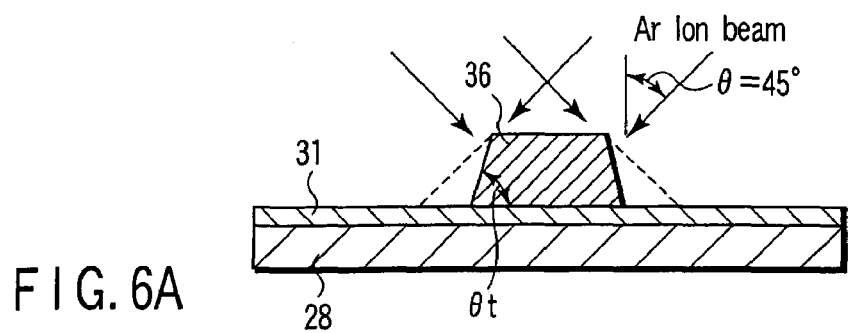
FIG. 6A is a cross-sectional view illustrating in greater detail the steps of forming the MTJ element shown in FIGS. 4A and 4B.
Figure 6B:
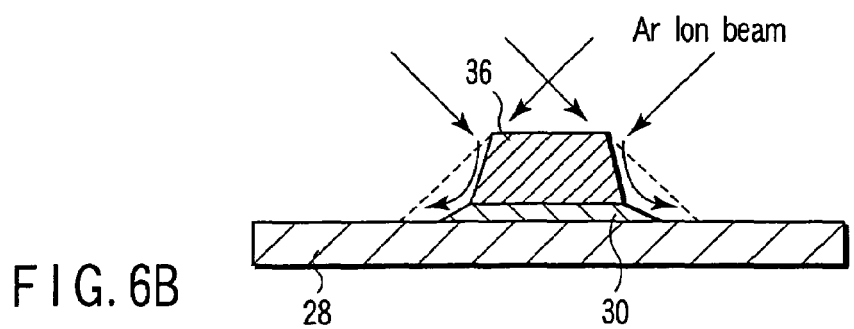
FIG. 6B is a cross-sectional view illustrating in greater detail the steps of forming the MTJ element shown in FIGS. 4A and 4B, following the step of FIG. 6A.
Figure 6C:
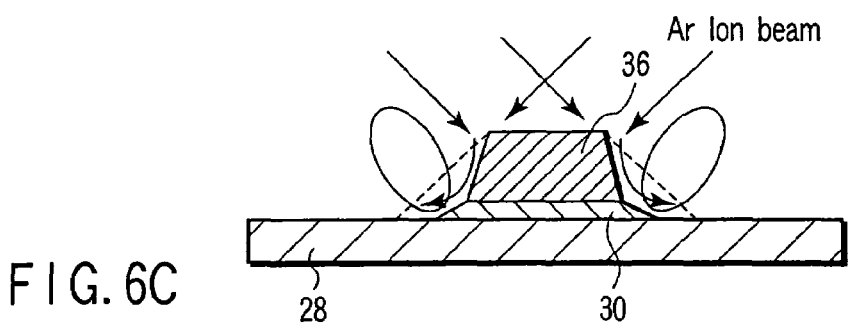
FIG. 6C is a cross-sectional view illustrating in greater detail the steps of forming the MTJ element shown in FIGS. 4A and 4B, following the step of FIG. 6B.

Now, the manufacturing process of the MTJ element 30 is described referring to FIG. 6A to FIG. 6C. FIGS. 6A to 6C are cross-sectional views showing the manufacturing process of the MTJ element according to the present embodiment.

FIG. 6A shows the lower electrode 28 formed above the semiconductor substrate 11, the magneto-resistive film 31 for forming the MTJ element 30 and the hard mask 36 having the taper angle θt. An Ar ion beam is made obliquely incident on the upper surfaces of the magneto-resistive film 31 and hard mask 36 at an angle θ to the upper surfaces. In this example, the Ar ion beam is made incident at the angle $\theta=45°$. For example, while this state is being maintained, the substrate 11 is rotated. Accordingly, the Ar ion beam is applied to the entire periphery of the hard mask 36 at 45°.

As a result, as shown in FIG. 6B, the magneto-resistive film 31 is etched by the Ar ion beam along the shape of the hard mask 36, and thus the MTJ element 30 is formed. Arrows indicated along the side surfaces of the MTJ element 30 and hard mask 36 represent the locus of recoil Ar ions from the side surfaces of the hard mask 36 and MTJ element 30.

Oval marks shown on both sides of the MTJ element 30 and hard mask 36 in FIG. 6C represent distributions of etched substance sputtered from the MTJ element 30 and hard mask 36 etched by the ion beam. Specifically, when the Ar ion etching is performed, the sputtered etched substances or particles do not adhere to the side surfaces of the MTJ element 30 since the hard mask 36 has the taper angle θt.

As shown in FIG. 7, the Ar ion beam emitted from the ion source 1 is directed toward the substrate 11. The substrate 11 is disposed on a sample stage (not shown). The substrate 11 can be rotated by rotating the sample stage. If the sample stage is rotated about the normal axis perpendicular to the substrate 11, the Ar ion beam is applied to the entire surface of the substrate 11 at the same incidence angle θ, and the Ar ion etching is performed. In addition, if the major surface of the substrate 11 of the magnetic memory device attached to the sample stage, on which major surface the MTJ element 30 is to be formed, is disposed to face downward, the etched substance removed by the Ar ion etching is prevented by gravitation from adhering to the side surfaces of the MTJ element 30.

FIG. 8A to FIG. 8D are graphs showing cumulative frequency distributions of junction resistance of the insulation barrier layer per unit area of the formed MTJ element, in a case where the angle of incidence, θ, of the Ar ion beam is varied at the time of forming the MTJ element 30. A number of MTJ elements each having a size of 4 $\mu m^2$ were manufactured. When each MTJ element 30 was formed by the Ar ion beam, as shown in FIGS. 6A to 6C, the etching angle θ was varied and the tendency of results was observed.

Figure 8A:
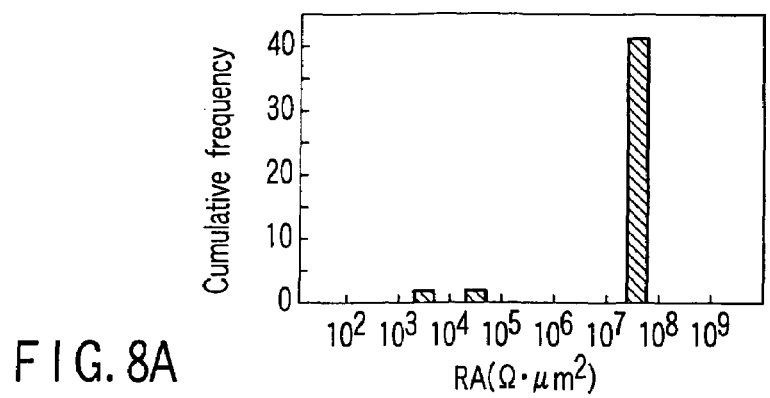
FIG. 8A is a graph showing a cumulative frequency distribution of junction resistance (RA) per unit area of the formed MTJ element, in a case where the angle of incidence of the Ar ion beam in the steps of FIGS. 6A to 6C is set at 45°.
Figure 8B:
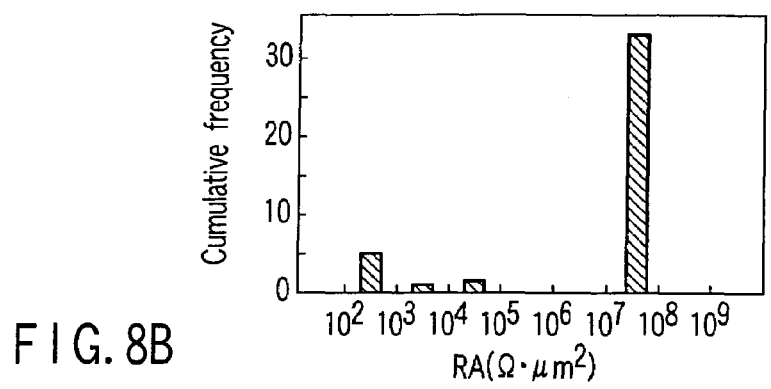
FIG. 8B is a graph showing a cumulative frequency distribution of junction resistance (RA) per unit area of the formed MTJ element, in a case where the angle of incidence of the Ar ion beam in the steps of FIGS. 6A to 6C is set at 30°.
Figure 8C:
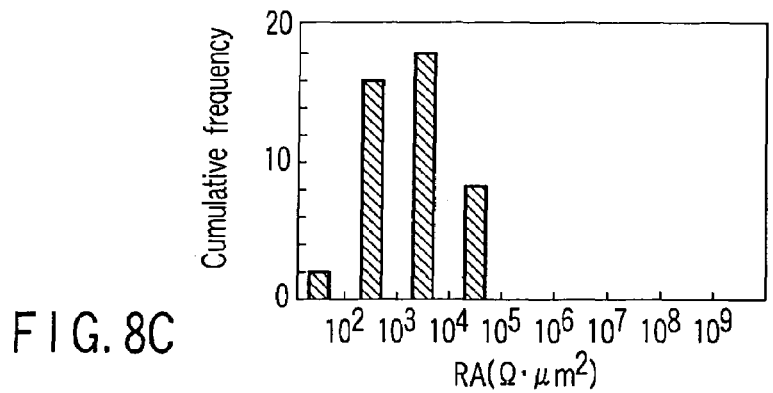
FIG. 8C is a graph showing a cumulative frequency distribution of junction resistance (RA) per unit area of the formed MTJ element, in a case where the angle of incidence of the Ar ion beam in the steps of FIGS. 6A to 6C is set at 0°.
Figure 8D:
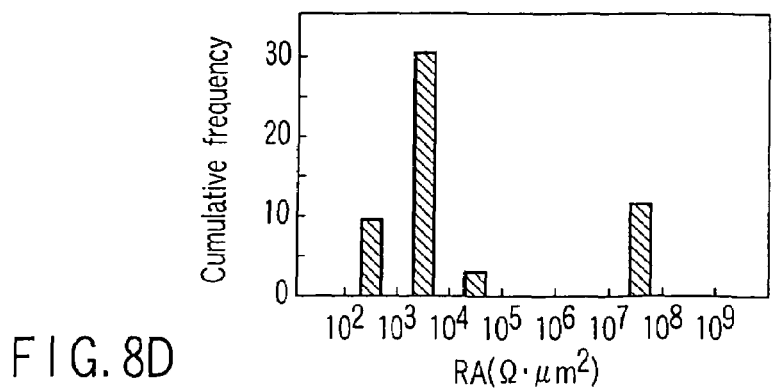
FIG. 8D is a graph showing a cumulative frequency distribution of junction resistance (RA) per unit area of the formed MTJ element, in a case where etching is performed with the angle of incidence of the Ar ion beam in the steps of FIGS. 6A to 6C being set at 0°, following which etching is performed once again with this angle of incidence being set at 45°.

In each case of FIGS. 8A to 8D, the abscissa indicates the junction resistance (hereinafter denoted by RA (resistance area product)) per unit area (unit=$\Omega \cdot \mu m^2$), as expressed by logarithm, and the ordinate indicates the cumulative frequency. In FIG. 8A, the etching was performed at $\theta=45°$. In FIG. 8B, the etching was performed at $\theta=30°$. In FIG. 8C, the etching was performed at $\theta=0°$. In FIG. 8D, the ion etching was first performed at $\theta=0°$, following which re-etching was performed at $\theta=45°$.

In the case of FIG. 8A where the etching was performed with the incidence angle of the ion beam being set at $\theta=45°$, most of the magnetic memory device samples exhibit the junction resistance RA ranging between $10^7$ $\Omega \cdot \mu m^2$ to $10^8$ $\Omega \cdot \mu m^2$. Thus, in the case of $\theta=45°$, most of the magnetic memory device samples exhibit satisfactory values of junction resistance RA.

Similarly, in the case shown in FIG. 8B where the incidence angle θ of the ion beam is 30°, normal junction resistance values are exhibited. However, cumulative frequency values of samples with low junction resistance RA in the range of $10^2$ Ω·μm$^2$ to $10^5$ Ω·μm$^2$ are slightly high. In short, the defect ratio is higher in the case where the ion beam angle θ is 30° than in the case where the ion beam angle θ is 45°.

In the case shown in FIG. 8C where the incidence angle θ of the ion beam is 0°, most of the magnetic memory device samples exhibit the junction resistance RA ranging between 10 Ω·μm$^2$ to $10^5$ Ω·μm$^2$. This means that most of the samples of the magnetic memory device are defective.

However, as is understood from FIG. 8D, in the case where the MTJ element 30 is first formed with the ion beam incidence angle θ being set at 0° and then the ion beam is made incident once again at the incidence angle θ=45°, the cumulative frequency values of junction resistance RA in the range between $10^2$ Ω·μm$^2$ to $10^5$ Ω·μm$^2$ decrease and the cumulative frequency values of junction resistance RA in the range between $10^7$ Ω·μm$^2$ to $10^8$ Ω·μm$^2$ increase. Thus, the defective ratio is decreased.

Figure 9A:
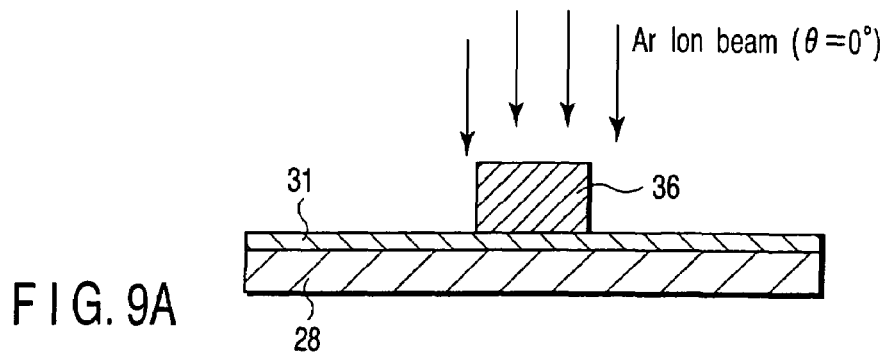
FIG. 9A is a cross-sectional view illustrating a step of forming the MTJ element in a case where the Ar ion beam is vertically made incident on the substrate.
Figure 9B:
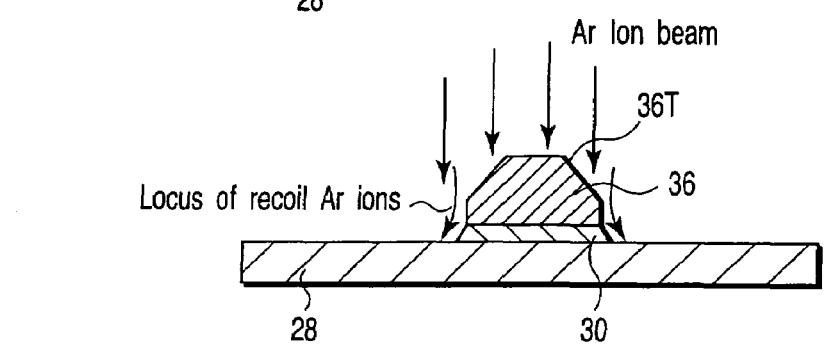
FIG. 9B is a cross-sectional view illustrating a step of forming the MTJ element in the case where the Ar ion beam is vertically made incident on the substrate, following the step of FIG. 9A.
Figure 9C:
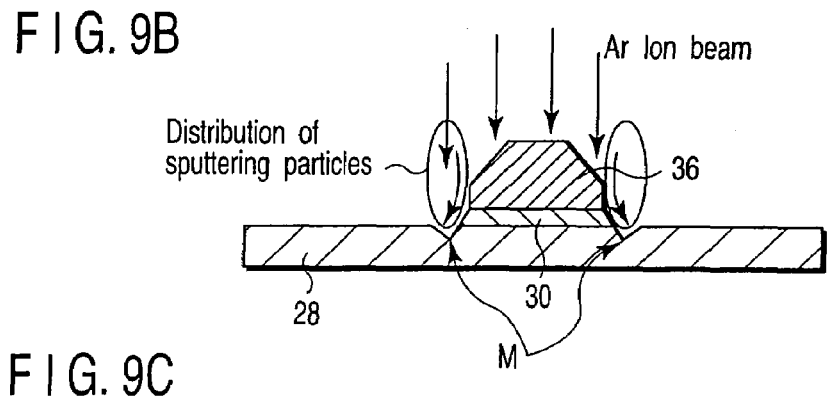
FIG. 9C is a cross-sectional view illustrating a step of forming the MTJ element in the case where the Ar ion beam is vertically made incident on the substrate, following the step of FIG. 9B.

Referring to cross-sectional views of FIGS. 9A to 9C, a brief description is given of the reason why the defective ratio considerably increases when the MTJ element 30 is formed with the ion beam incidence angle θ set at 0°. Note that in FIGS. 9A to 9C, unlike the case shown in FIGS. 6A to 6C, the taper angle θt of the hard mask 36 is 90° and the Ar ion beam incidence angle θ to the side walls of the hard mask 36 is 0°.

FIG. 9A shows the cross-sectional shapes of the wiring layer 28, magneto-resistive film 31 and hard mask 36, which are formed above the semiconductor substrate, at the time of the start of the Ar ion etching process.

If the Ar ion beam is made vertically incident on the semiconductor substrate surface, the beam falls substantially in parallel to the side surfaces of the hard mask 36. In fact, however, a slight rounded or inclined portion is present at the edge part at the boundary between the upper surface and side surface of the hard mask 36. Because of this, a taper portion 36T forms at the edge part as in the case of FIG. 6B.

Figure 10:
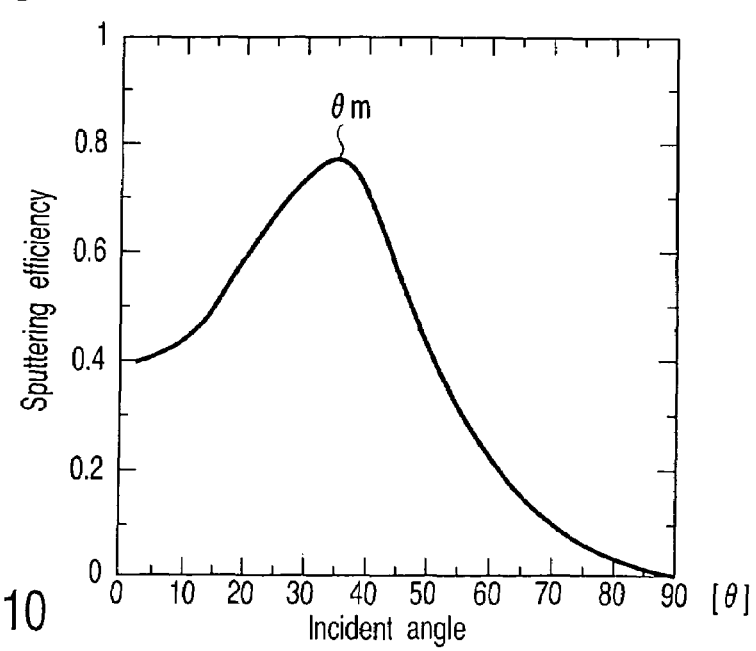
FIG. 10 is a graph plotting a variation in sputtering efficiency relative to an incidence angle (θ) of the ion beam.

FIG. 10 shows the dependence of the sputtering efficiency of the material used for the hard mask upon the ion beam incidence angle in the example in which Ta is used as the material of the hard mask 36. As is understood from FIG. 10, the sputtering efficiency is substantially zero in the case of parallel incidence (θ=0°) to the side surface of the Ta hard, that is, at the angle at which the ion beam is incident perpendicular to the surface of the magneto-resistive film 31.

Specifically, as shown in FIGS. 9A to 9C, when the Ar ion beam is applied in parallel to the side surface of the hard mask 36, the Ar ion beam etches the upper surface of the hard mask 36 and the surface of the magneto-resistive film 31 while keeping its momentum. In this case, the edge part of the upper surface of the hard mask 36 is etched while being gradually tapered, as mentioned above, and the taper surfaces 36T, as shown in FIG. 9B, are formed.

On the other hand, in a region of the magneto-resistive film 31, which is close to the edge part at the lower surface of the hard mask 36, part of the kinetic energy of the incident ion beam is absorbed by the Ar beam recoiling from the taper surface 36T of hard mask 36, and by a nebular substance dispersed by etching from the surfaces of the hard mask 36 and magneto-resistive film 31. The amount of energy absorption becomes greater toward the edge part. At last, a taper portion of the magneto-resistive film 31 remains around the hard mask 36, as shown in FIG. 9B, and the MTJ element 30 is formed. In FIG. 9B, curved arrows extending along the side surfaces of the hard mask 36 and MTJ element 30 indicate the locus of the recoil Ar ions.

When etching is performed by radiation of an Ar ion beam, both the hard mask 36 and the to-be-etched film 31 retreat while forming facets determined by the dependency of the sputtering efficiency upon the ion beam incidence angle.

However, as shown in FIG. 9B, vertical mask side surfaces of the hard mask 36 remain in the state in which the MTJ element 30 is formed. Thus, as the ion beam radiation progresses, the beam concentration on the lower part of the mask side surface continues. FIG. 9C shows the state in which the beam concentration on the lower part of the side surface of the mask 36 continues. Two oval marks in FIG. 9C indicate distributions of the dispersed substance, i.e. sputtering substance or particles.

To be more specific, since the Ar ion beam is vertically applied to the upper surface of the MTJ element 30, the sputtering particles produced by the etching of the upper and side surfaces of the MTJ element 30 concentrates near the MTJ element 30. Consequently, the ratio of re-deposition to the element increases and a great amount of sputtering particles adhere to the hard mask and the side surfaces of the etched MTJ element 30.

As a result, in the MTJ element 30 with the structure shown in FIG. 1, the magnetic layers 33 and 35 vertically sandwich the insulation barrier layer 34 which is rendered conductive due to the conductive sputtering substance film or particles adhering to the inclined side surfaces of the insulation barrier layer 34. This lowers the junction resistance RA and leads to an initial defect of the MTJ element 30.

If the Ar ion beam radiation further continues, the ion beam concentrates at the lower edge parts of the MTJ element 30 due to the recoiling beams from the side surfaces of the hard mask 36 and MTJ element 30. As is shown in FIG. 9C, the surface of the lower electrode 28, which is the wiring layer, is recessed and micro-trenches M are formed.

As has been described above, when the etching with the Ar ion beam is performed, the sputtering substance film adheres to the side surfaces of the MTJ element 30, which leads to an initial defect and formation of micro-trenches M in the lower electrode 28. It is understood, as stated above, that the defect in the MTJ element 30 depends on the etching beam incidence angle.

In the case where the Ar ion beam is obliquely applied at the angle θ, as shown in FIG. 6A and FIG. 6B, the Ar ion beam is made obliquely incident on the inclined surfaces of the hard mask 36. Consequently, the Ar ion beam recoils away from the MTJ element 30 while keeping its momentum. As a result, as shown in FIG. 6C, the dispersed substance is largely distributed in regions separated from the MTJ element 30.

At the time of etching, the hard mask 36 and magneto-resistive film 31, which are to be etched, are rotated relative to the obliquely incident Ar ion beam. Thus, there is a time period in which the side surface of the MTJ element 30, which is opposite to the side surface thereof that is irradiated with the beam, is hidden behind the mask 36. In this time period, the hidden side surface is not etched. In addition, the MTJ element 30 itself has the ion beam incidence angle dependency of the sputtering efficiency. Hence, the side surfaces of the MTJ element 30 are processed at a fixed angle due to these factors.

The aforementioned hidden side surfaces are regions below broken lines in FIGS. 6A to 6C. In this case, the center of distribution of sputtering substance departs from each side surface of the etched hard mask 36 and MTJ element 30. Accordingly, the occurrence of a defect due to re-deposition of sputtering substance to the side surfaces is less possible. Furthermore, since the ion beam strikes the surface of the lower electrode 28 at a narrow angle, no micro-trenches form on the surface of the lower electrode 28.

From the above description of the embodiment, it is understood that the defect ratio of the MTJ element 30 can effectively be reduced by using ion etching with an ion beam made obliquely incident on the upper surface of the magneto-resistive film 31 in the micro-manufacturing process of the MTJ element 30.

In order to examine the relationship between the performance of the formed MTJ element 30 and the incidence angle for the Ar ion etching, etc., magnetic memory devices including the MTJ element 30, which were manufactured under various conditions, are described in detail with reference to FIGS. 11A to 13C.

A resist film to be used for a micro-manufacturing process of the MTJ element 30 is formed by photo-lithography by means of an exposing apparatus using an excimer laser. In addition, Ar ion etching is employed to form the MTJ element 30 out of the magneto-resistive film. Instead of the photolithography by means of the exposing apparatus using the excimer laser, photolithography using a contact aligner may be adopted to form the resist mask. Detailed manufacturing process steps of the lower electrode 28 and MTJ element 30 are the same as those described with reference to FIGS. 6A to 6C, so a description thereof is omitted here. The process conditions are described below in detail.

In the course of the manufacturing process, the conditions for the micro-fabrication of the hard mask 36 and MTJ element 30 are varied. Four examples are described referring to FIGS. 11A to 11D, respectively.

Figure 11A:
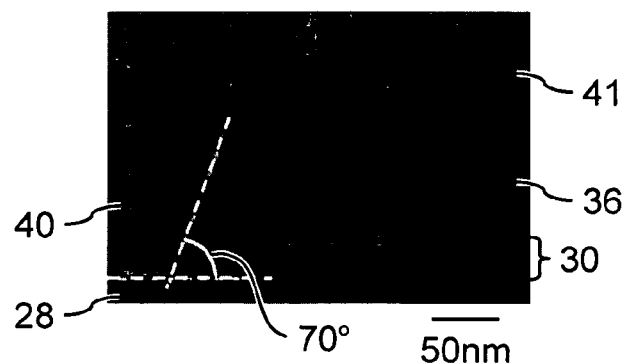
FIG. 11A is a cross-sectional view showing an MTJ element in which the angle of a side surface extending across an insulation barrier layer is 70°.

In a first example shown in FIG. 11A, RIE for forming the hard mask 36 was conducted using chlorine gas. Then, in order to form the MTJ element 30, Ar ion etching was performed with the incidence angle θ set at 30°.

Figure 11B:
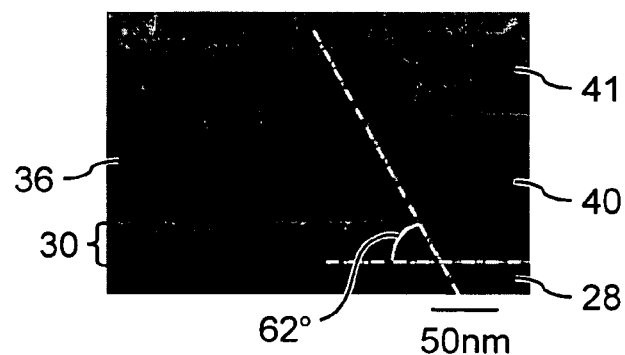
FIG. 11B is a cross-sectional view showing an MTJ element in which the angle of a side surface extending across an insulation barrier layer is 62°.

In a second example shown in FIG. 11B, RIE for forming the hard mask 36 was conducted using chlorine gas. Then, in order to form the MTJ element 30, Ar ion etching was performed with the incidence angle θ set at 45°.

Figure 11C:
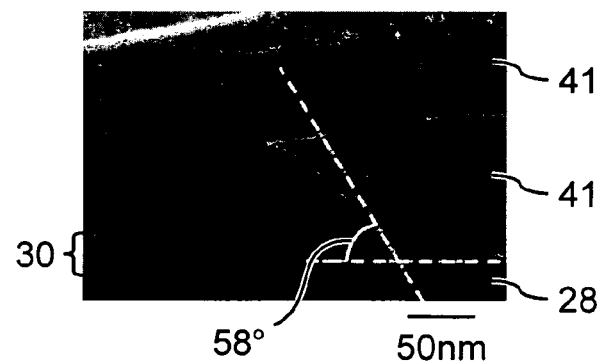
FIG. 11C is a cross-sectional view showing an MTJ element in which the angle of a side surface extending across an insulation barrier layer is 58°.

In a third example shown in FIG. 11C, RIE for forming the hard mask 36 was conducted using a fluorocarbon gas. Then, in order to form the MTJ element 30, Ar ion etching was performed with the incidence angle θ set at 30°.

Figure 11D:
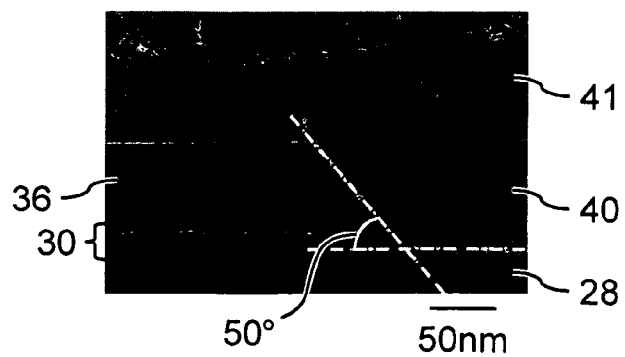
FIG. 11D is a cross-sectional view showing an MTJ element in which the angle of a side surface extending across an insulation barrier layer is 50°.

In a fourth example shown in FIG. 11D, RIE for forming the hard mask 36 was conducted using a fluorocarbon gas. Then, in order to form the MTJ element 30, Ar ion etching was performed with the incidence angle θ set at 45°.

In FIGS. 11A to 11D, the angle (taper angle θmtj) of the side surface extending over the insulation barrier layer of the MTJ element 30 is 70°, 62°, 58° and 50°, respectively. Further, in FIGS. 11A to 1D, the defect ratio of the MTJ element 30 is 95%, 5%, 1.5% and 0.2%, respectively.

Figure 12:
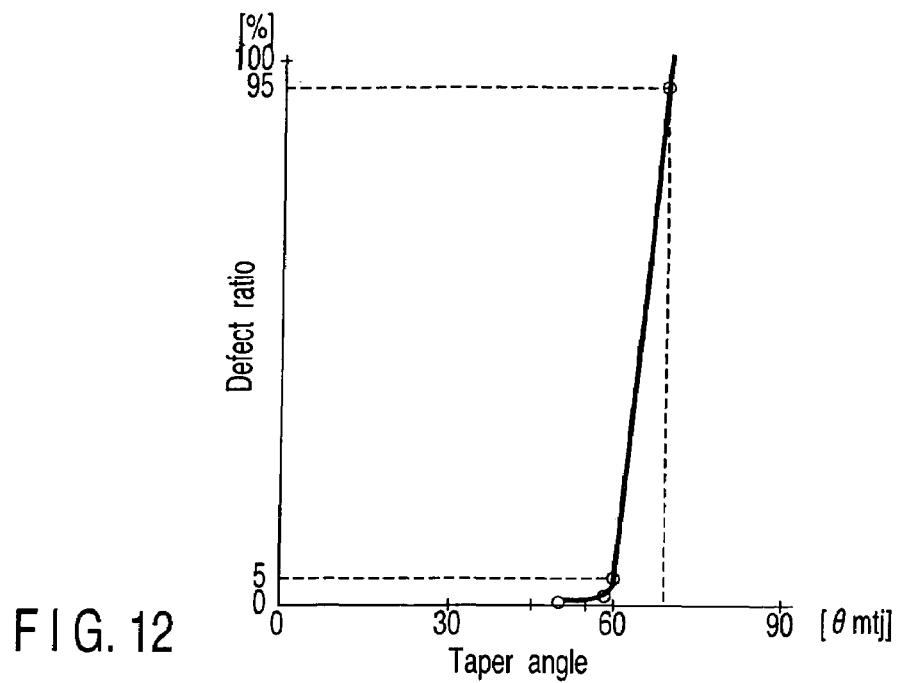
FIG. 12 is a graph showing a defect ratio of the magnetic memory device, relative to a variation in angle of the side surface extending across the insulation barrier layer of the MTJ element.

FIG. 12 is a graph plotting the relationship between the defect ratio and the taper angle θmtj in the above-described four examples. In FIG. 12, the abscissa indicates the first taper angle [unit: θmtj] and the ordinate indicates the defect ratio [unit: %]. As is understood, a straight portion of the plotted curve crosses the horizontal axis at about 60°. That is, the upper limit of the taper angle θmtj, at which the defect ratio is 0%, is about 60°.

In other words, in FIG. 12, the defect ratio sharply rises if the taper angle θmtj exceeds 60°. When the hard mask 36 is etched with chlorine gas, the taper angle θmtj is much greater than in the case of the etching using fluorocarbon gas. The reason is discussed below.

Figure 13A:
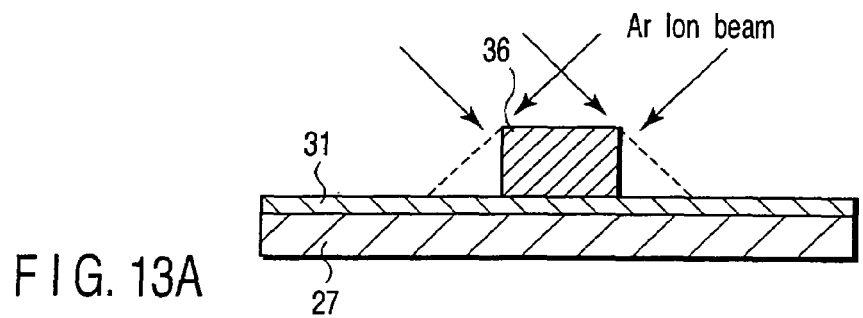
FIG. 13A is a cross-sectional view showing the structure of a magnetic memory device in a case where the MTJ element is formed by obliquely applying an Ar ion beam in the state in which a hard mask side surface is not inclined.
Figure 13B:
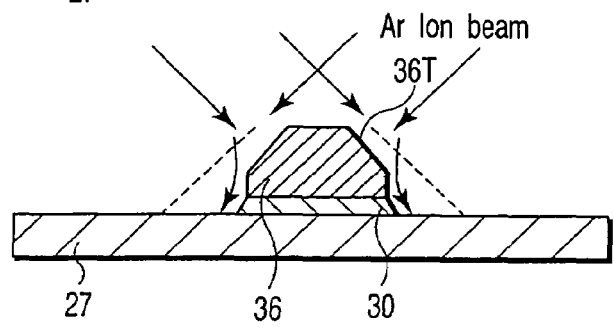
FIG. 13B is a cross-sectional view showing the structure of the magnetic memory device, following the step of FIG. 13A, in the case where the MTJ element is formed by obliquely applying the Ar ion beam in the state in which the hard mask side surface is not inclined.
Figure 13C:
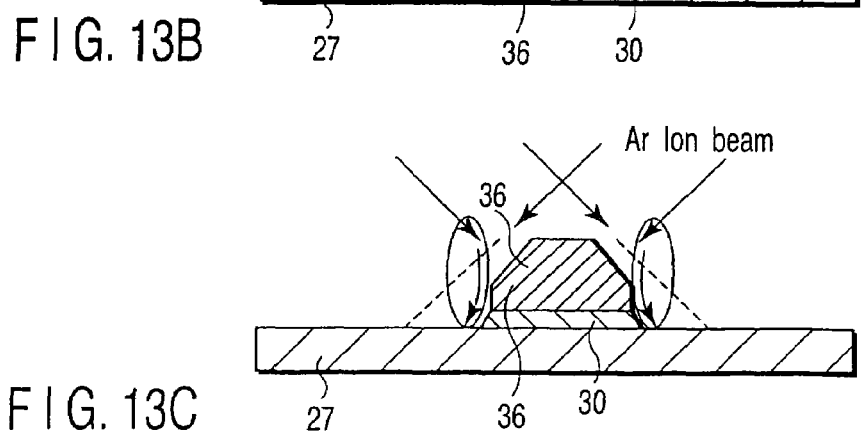
FIG. 13C is a cross-sectional view showing the structure of the magnetic memory device, following the step of FIG. 13B, in the case where the MTJ element is formed by obliquely applying the Ar ion beam in the state in which the hard mask side surface is not inclined.

In the case of chlorine gas etching, as shown in FIGS. 13A to 13C, the taper angle θt of the side surface of the hard mask 36 is nearly 90°, and the Ar ion etching with oblique incidence of the beam is performed. However, Ar ions are applied substantially perpendicularly to a taper surface 36T formed at the side surface of the hard mask 36, and thus the taper surface 36T is etched. Consequently, a recoil ion beam occurs and dispersed substance is easily re-deposited to the side surface of the MTJ element 30. This appears to be the reason.

It is understood, from FIG. 12, that if the taper angle θmtj of the side surface of the MTJ element 30 is set at about 60° or less, the initial defect ratio is substantially 0%. Even where the taper angle θmtj is, e.g. 30°, there would be no problem as far as the initial defect ratio is concerned. However, compared to the case where the taper angle θmtj is 60° the area of projection of the MTJ element 30 onto the lower electrode 28 increases. Accordingly, the area occupied by the memory cell array on the chip is reduced by increasing the taper angle θmtj as much as possible.

In FIGS. 13B and 13C, arrows indicated along the side surfaces of the hard mask 36 represent the locus of recoil Ar ions. In FIG. 13C, oval marks shown along the side surfaces of the hard mask 36 represent distributions of dispersed substance particles etched by sputtering.

Further, in the case where the RIE for forming the hard mask 36 is performed using the fluorocarbon gas, the defect ratio is low. The reason why the fluorocarbon gas is effective in decreasing the defect ratio is that the taper angle θt formed on the side surface of the hard mask 36 is smaller in the case of the etching with the fluorocarbon gas than in the case of the etching with chlorine gas.

Taken together, it is understood that the flow amount of recoil ions is minimum when the following equation is established:

$$\theta = \theta t - \theta m$$

where θm is the angle at which a maximum sputtering efficiency of the hard mask 36 is obtained, as shown in, e.g. FIG. 10; θt is the second taper angle that is the angle of the side surface of the hard mask 36; and θ is the ion beam incidence angle to the normal line of the substrate 11. For example, in FIG. 10, since θm=35°, θ=40° if θt=75°.

With the formation of the MTJ element 30 by the above-described micro-fabrication, the cross-sectional structure of the magnetic memory device including the MTJ element, which can prevent an initial cell defect in the magnetic memory device, can be realized. In the process of manufacturing the magnetic memory device according to the present embodiment, Ar ion etching is used for etching the MTJ element 30. Needless to say, the same technical concept is applicable to cases where RIE or sputter etching is used.

As regards a second embodiment of the present invention, the structure of a magnetic memory device is described along with the manufacturing process thereof with reference to the drawings. In the description of the second embodiment below, the structural parts, which are the same or similar to those in the first embodiment are denoted by the same or like reference numerals and a detailed description thereof is omitted to avoid overlapping description.

Figure 14A:
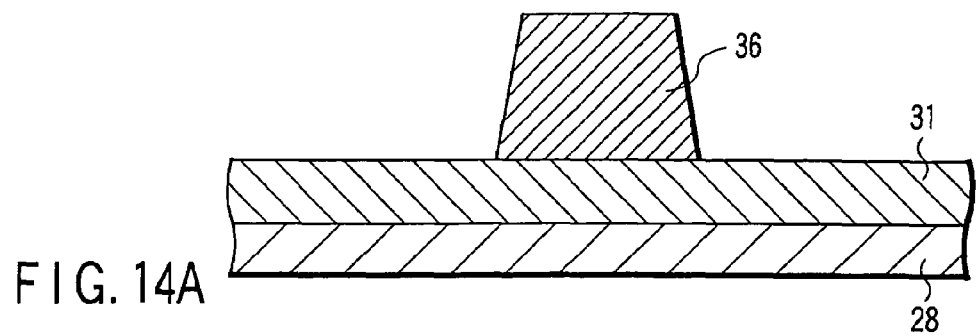
FIG. 14A is a cross-sectional view illustrating a step of forming an MTJ element in a magnetic memory device according to a second embodiment of the present invention.

FIG. 14A is a cross-sectional view illustrating a step in the manufacturing process of the MTJ element with the structure shown in FIG. 1. The manufacturing process of the MTJ element according to the second embodiment includes steps different from those of the first embodiment.

As is shown in FIG. 14A, a lower electrode 28 is formed on a substrate (not shown) by sputtering. A magneto-resistive film 31 for forming the MTJ element 30 and a hard mask 36 are formed on the lower electrode 28. The magneto-resistive film 31, like the MTJ element 30 shown in FIG. 1, includes as an insulation barrier layer formed of AlOx with a thickness of about 1 to 2 nm. The insulation barrier layer is sandwiched between a fixed layer called a pin layer, which is formed of a ferromagnetic layer, and a recording ferromagnetic layer called a free layer. Further, although not shown, the magneto-resistive film 31 may have a multilayer structure including a buffer layer and a gap layer.

The hard mask 36 is formed by etching using a resist mask for forming the MTJ element 30 with a predetermined pattern, such that the side wall thereof has a predetermined inclined angle. For example, when Ta is used as material of the hard mask 36, the etching therefor may be effected by RIE using $Cl_2$ or fluorine (F)-based etching gas. In this case, the angle of inclination of the side wall of the hard mask 36 of Ta is set at about 70° to 80° due to the selectivity of RIE to the resist mask.

Figure 14B:
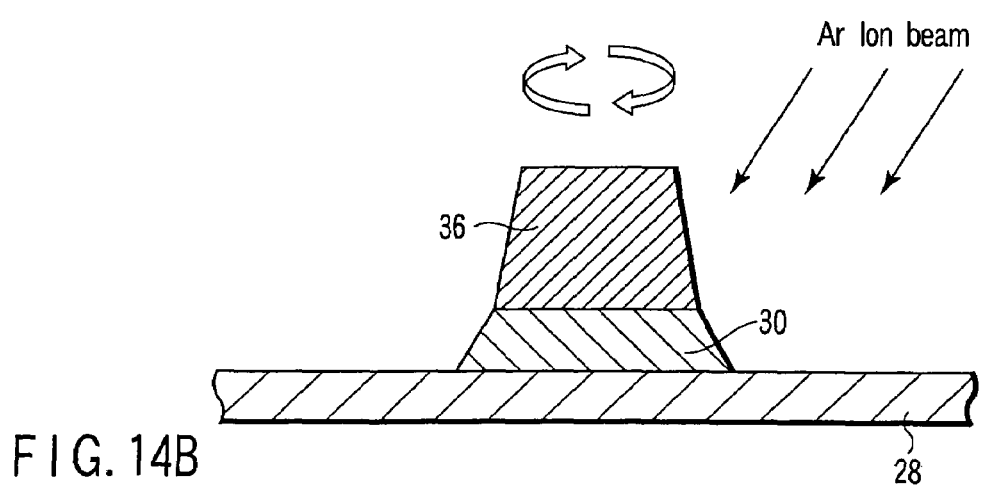
FIG. 14B is a cross-sectional view illustrating a step of forming the MTJ element in the magnetic memory device, following the step of FIG. 14A.

Subsequently, as shown in FIG. 14B, using the hard mask 36 as a mask, the magneto-resistive film 31 is etched by an Ar ion beam. For example, the Ar ion etching is performed by using an Ar ion source 1, as shown in FIG. 7, such that the generated Ar ion beam is applied at an incidence angle θ to the normal line perpendicular to the major surface of the substrate. The condition for the Ar ion etching is, for example, that the incidence angle θ to the substrate is set at 10° to 45° in the state in which the substrate is rotated in the direction of the arrow in FIG. 14B. Thereby, the MTJ element 30 with a predetermined side wall angle is obtained. The side wall angle of the MTJ element 30 may be set at any angle. For example, in a case where the integration density is high when the MRAM is formed on a chip, a steep angle is set. On the other hand, when the integration density is low, a gentler angle may be set. In the case of the second embodiment, unlike the first embodiment, after the process step of FIG. 14A, a contaminant dispersed by Ar ion beam etching deposits, in the form of a film, on the side wall of the MTJ element 30.

Figure 15A:
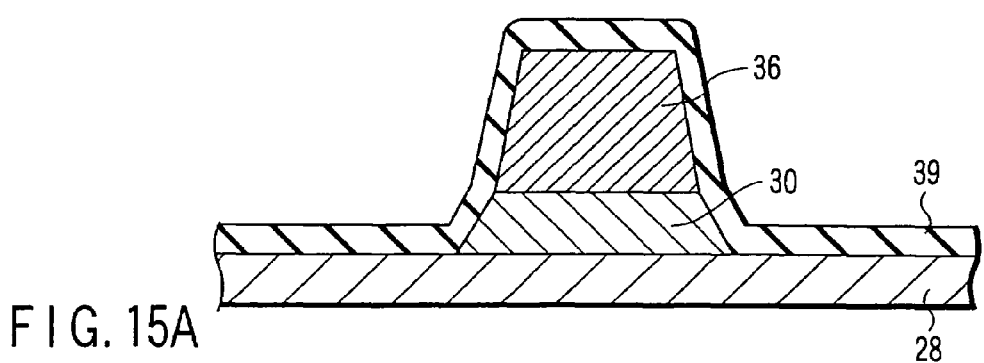
FIG. 15A is a cross-sectional view illustrating in detail a step of forming the MTJ element in the magnetic memory device, following the step of FIG. 14B.

Thereafter, as shown in FIG. 15A, a protection film 39 is deposited by reactive sputtering using, e.g. AlOx, over the entire surfaces of the lower electrode 28, MTJ element 30 and hard mask 36 shown in FIG. 14B. In particular, in order to enhance the coverage on taper surfaces of the hard mask 36 and MTJ element 30, the protection film 39 is formed by bias sputtering to a thickness of about 20 nm.

Figure 15B:
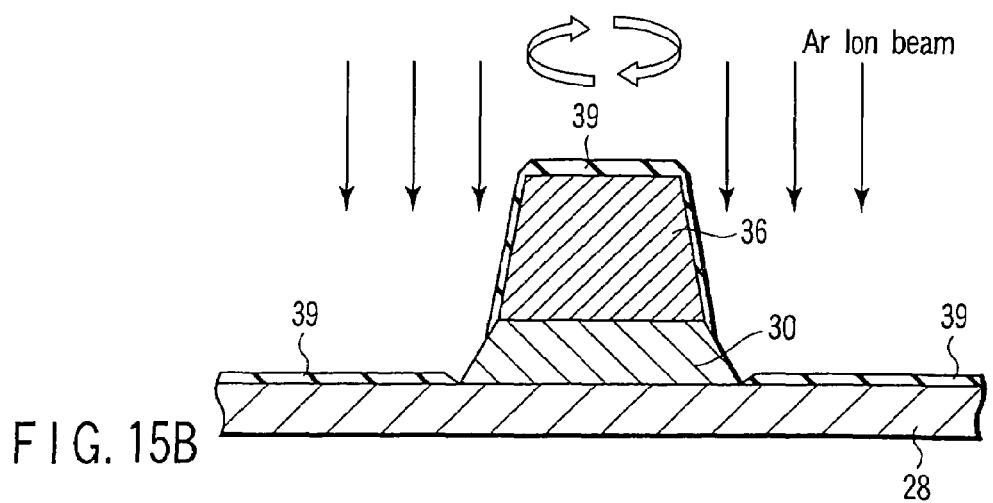
FIG. 15B is a cross-sectional view illustrating in detail a step of forming the MTJ element in the magnetic memory device, following the step of FIG. 15A.

Next, as shown in FIG. 15B, Ar ion etching is performed over the entire upper surfaces of the lower electrode 28, MTJ element 30 and hard mask 36 by applying an Ar ion beam at an incidence angle θ of 0° to the normal line of the rotating substrate. FIG. 16 shows the ion beam incidence angle dependency of the etching rate of the material used for the protection film 39, referring to AlOx by way of example. As shown in FIG. 16, the etching rate, that is, the sputtering efficiency, varies so as to have a peak at a certain angle. As is understood from FIG. 16, the etching rate takes a maximum value at the incidence angle θ of about 60° in the case of the ion etching performed on AlOx of the insulative protection film 39.

Accordingly, for example, if the incidence angle of the ion beam applied to the taper surface of the MTJ element 30 with a predetermined side wall angle is set at about 60°, that part is etched earliest, compared to the other parts. In the case of FIG. 16, the ratio in etching rate between the incidence angle of 60° and the incidence angle 0° is about 3.

In the case of FIG. 15B, the incidence angle of the Ar ion beam to the normal line of the substrate is 0°. Thus, the angle of incidence to the taper surface of the MTJ element 30 is greater than the incidence angle to the side wall of the hard mask 36. Accordingly, as is understood from FIG. 16, the etching rate of the AlOx protection film 39 deposited on the taper surface is larger than that on the side wall of the hard mask 36. If the side wall angle of the MTJ element 30 is 30° in FIG. 15B, the incidence angle of the ion beam to the taper surface of the MTJ element 30 is 60° and a maximum etching rate of the AlOx protection film is obtained.

As a result, the protection film 39 on the side surface of the MTJ element 30 is first removed. As is shown in FIG. 15B, in the state in which the side surface of the MTJ element 30 is exposed, the protection film 39, although thin, remains on the other positions including the upper surface of the lower electrode 28. Thus, it should suffice if the protection film 39 is etched until the contaminant film with electrical conductivity attached to the taper surface of the MTJ element 30 by re-deposition is removed and cleaned in the state in which the side surface of the MTJ element 30 is exposed.

Thereafter, in the state in which the protection film 39 remains on the lower electrode 28, an interlayer insulation film is formed on the entire surface. Alternatively, it is possible that after the remaining protection film 39 shown in FIG. 15B is completely removed by etching, an interlayer insulation film is formed on the entire surface.

In the present embodiment, the taper angle of the hard mask 36 is made greater than that of the MTJ element 30 and thus the etching rate of the protection film 39 on the hard mask 36 is made lower than that of the protection film 39 on the side surface of the MTJ element 30. As a result, when the protection film 39 on the side surface of the MTJ element 30 is removed, the protection film 39 remains on the side surface of the hard mask 36 as shown in FIG. 15B. Thereby, the hard mask 36 that is formed of electrically conductive material is prevented from being etched. In short, it should suffice if the Ar ion beam incidence angle is adjusted such that the etching rate of the protection film 39 on the side surface of the MTJ element 30 is higher than that of the protection films 39 on the side surface of the hard mask 36 and on the lower electrode 28. Accordingly, the taper angle θmtj of the MTJ element 30 and the taper angle θt of the hard mask 36 can be set at various values in the manufacturing process. In a wide practical range of the taper angle θmtj of the MTJ element, the ion beam incidence angle θ to the side surface of the MTJ element 30 is adjusted at, e.g. 60°. Thereby, only the side surface of the MTJ element 30 can be preferentially exposed, and contamination due to conductive material can be cleaned.

The time period for carrying out the ion beam etching of the protection film 39 is set such that after the start of the etching, the film of the aforementioned contaminant can be removed in the state in which only the side surface of the MTJ element 30 is exposed. A time t, at which only the side surface of the MTJ element 30 is exposed, is given by $$t = d*(ER(\theta mtj - \theta) - ER(\theta))/(ER(\theta mtj - \theta)*ER(\theta))$$

where ER(θ) is the etching rate relative to the Ar ion beam incidence angle (θ) at the time of etching the protection film 39 by the ion beam; θmtj is the taper angle of the MTJ element 30; and d is the thickness of the protection film 39. It is understood from this that in order to increase the time in which only the side surface of the MTJ element 30 is exposed, that is, in order to increase the cleaning time t, this is realized by increasing the thickness d of the protection film 39, increasing the angle dependency of the etching rate of the protection film 39, and lowering the etching rate ER(θ) of the protection film 39.

As described above, after the formation of the MTJ element 30, the contaminant film on the taper surface is removed. Thereby, it is possible to suppress a short-circuit occurring, for example, in the tunneling barrier film between the ferromagnetic layers of the MTJ element 30 via the taper surface. When the side surface of the MTJ element 30 is exposed and cleaned by ion etching, the lower electrode 28 and hard mask 36 are covered with the protection films 39. Therefore, even in a case where film-like etched material adheres to the side surface of the MTJ element 30 in the step of the ion etching, the etched material is the protection film 39, i.e. the insulator, and does not become a factor of short-circuit.

The thickness of the protection film 39 on the side surface of the MTJ element 30 can be made less than that on the lower electrode by properly setting the conditions for bias sputtering. Thereby, the cleaning time in which only the side surface of the MTJ element 30 is exposed, that is, the width of the process window, can be increased. As has been described above, in the wide practical range of the taper angle θmtj of the MTJ element 30, the contaminant film on the side surface of the MTJ element can effectively be removed.

In the second embodiment, the taper angle of the hard mask 36 is made greater than that of the MTJ element 30. Thereby, the insulation film on the side wall of the hard mask remains due to the angle dependency of the etching rate, which quickly decreases on the large incidence angle side. Therefore, the metallic contamination source to the side wall of the MTJ element can be suppressed.

On the other hand, as will be described below, the taper angle of the hard mask may be made smaller than the taper angle of the side wall of the MTJ element.

A magnetic memory device according to a third embodiment of the present invention and a method of manufacturing the magnetic memory device will now be described referring to FIGS. 17A through 18C. In the third embodiment, the parts common to those in the above-described second embodiment are denoted by like reference numerals, and a detailed description thereof is omitted.

In FIG. 17A, a lower electrode 28, a magneto-resistive film 31, a hard mask film 36B and a hard mask 37 are successively formed on a substrate (not shown). In order to form the hard mask film 36B on the magneto-resistive film 31, Ta is used to form the film 36B and the Ta hard mask film 36B is formed by sputtering to a thickness of about 100 nm. Subsequently, an insulation film for the hard mask 37 is formed on the hard mask film 36B. Silicon dioxide ($SiO_2$) is used as material of the insulation hard mask 37, and the insulation film is formed by sputtering to a thickness of about 190 nm. Then, a resist film is deposited on the upper surface of the insulation film for hard mask 37. The resist film is patterned to form a resist mask.

After the resist film deposited on the insulation film for the hard mask 37 is patterned, the insulation film for the hard mask 37 is etched by RIE using $CHF_3$ gas, employing the formed resist mask. At the time of etching, the etching is controlled such that the depth of etching of the insulation film for hard mask 37 having a thickness of 190 nm is set at about 170 nm, and the remaining film has a thickness of 20 nm. By removing the resist pattern on the insulation film for hard mask 37, the hard mask 37 having the shape shown in FIG. 17A is formed.

Subsequently, using the formed hard mask 37, etching is conducted on the hard mask 37 and hard mask film 36B, for example, under conditions that the voltage of the ion beam is 500 V, the ion beam current amount $I_B$=250 mA, the ion acceleration voltage $V_B$=250 V, and the incidence angle=0°. The etching is so performed that the thickness of the remaining hard mask 36B under the thin portion of the hard mask 37 is about 10 nm. As a result, as shown in FIG. 17B, the pattern of the hard mask 37 is transferred to the hard mask 36B, and the hard mask 36 is formed.

In the pattern transfer step, since the etching rate of $SiO_2$ of the hard mask 37 is higher than that of Ta of the hard mask 36, the thickness and area of the hard mask 37 are reduced, as shown in FIG. 17B. As a result, the hard mask 36 is configured to have a taper angle θt of, e.g. about 60°.

Figure 18A:
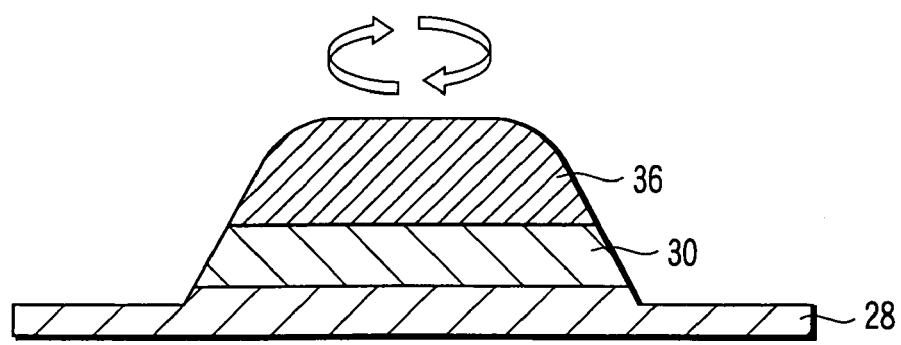
FIG. 18A is a cross-sectional view illustrating in detail a step of forming the MTJ element in the magnetic memory device, following the step of FIG. 17B.

Using the formed hard mask 36 having the predetermined shape, the magneto-resistive film 31 is etched. By the etching of the magneto-resistive film 31, the magneto-resistive film 31 is separated to have a shape corresponding to the hard mask 36, and patterned to the shape of the MTJ element 30, as shown in FIG. 18A. The upper part of the lower electrode 28, which is not covered with the hard mask 36, is removed due to over-etching at the time of the formation of the MTJ element 30. As a result, a recess portion, which has a lower level than the lower surface of the MTJ element 30, is formed on the upper part of the lower electrode 28.

In the third embodiment, the etching for forming the MTJ element 30 shown in FIG. 18A is effected by Ar ion beam etching using the hard mask 36 as a mask. The Ar ion beam etching is performed, for example, under conditions that the voltage of the ion beam is 400 V, the ion beam current amount $I_B$=100 mA, the ion acceleration voltage $V_B$=100 V, and the incidence angle θ to the normal line of the substrate is about 45°. A contaminant conductive film (not shown) is formed on the taper surface of the MTJ element 30.

Figure 18B:
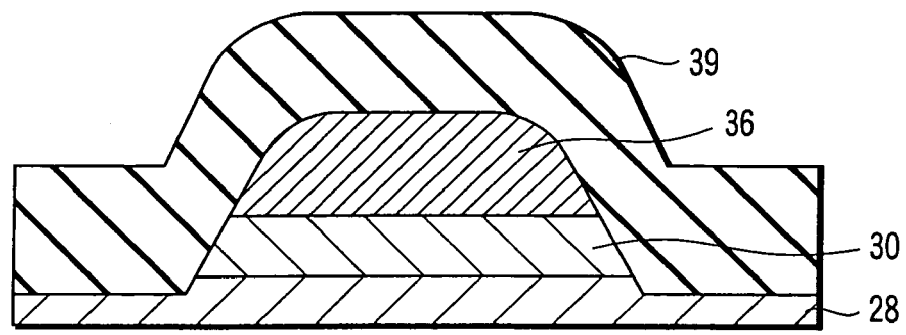
FIG. 18B is a cross-sectional view illustrating in detail a step of forming the MTJ element in the magnetic memory device, following the step of FIG. 18A.

Thereafter, as shown in FIG. 18B, a protection film 39 serving as an insulation film is deposited by, e.g. reactive sputtering, on the entire surfaces of the lower electrode 28, MTJ element 30 and hard mask 36. In particular, in order to enhance the coverage on the side surface of the hard mask 36, the protection film 39 is formed by bias sputtering, using, e.g. $SiO_2$, to a thickness of about 80 nm. Next, Ar ion etching is performed over the entire upper surfaces of the lower electrode 28, MTJ element 30 and hard mask 36 by applying an Ar ion beam at an incidence angle θ of 0°.

The conditions for the Ar ion beam etching are, for example, that the voltage of the ion beam is 500 V, the ion beam current amount $I_B$=250 mA, the ion acceleration voltage $V_B$=250 V, and the incidence angle θ to the normal line of the substrate is about 0°. The Ar ion beam etching is performed such that the $SiO_2$ protection film 39 with a thickness of about 10 nm remains on the upper surface of the hard mask 36 and lower electrode 28. At the time of the ion beam etching after the deposition of the insulation film, as is described later, the ion beam etching is performed in the state in which the side surfaces of the MTJ element 30 are exposed. Thereby, a contaminant conductive film attached at the time of the preceding etching step for forming the MTJ element 30 can effectively be removed. Thereafter, in the state in which the protection film 39 remains on the upper surface of the hard mask 36 and the lower electrode 28, an interlayer insulation film (not shown) is formed on the entire surface of the substrate.

Figure 18C:
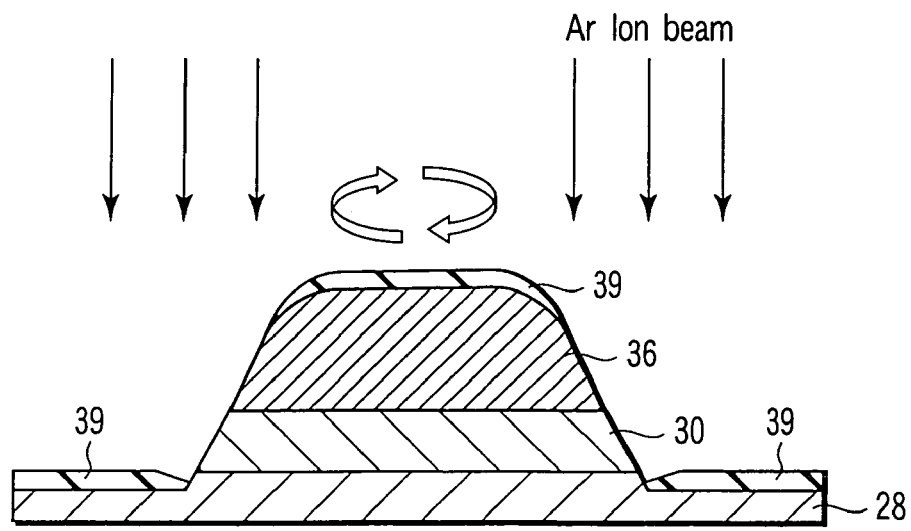
FIG. 18C is a cross-sectional view illustrating in detail a step of forming the MTJ element in the magnetic memory device, following the step of FIG. 18B.

In the case of the ion etching on the SiO$_2$ of the protection film 39, like the etching on AlOx, the incidence angle θ to the surface thereof, at which the sputtering efficiency becomes maximum, is about 60°. The ratio in etching rate between the case where the incidence angle θ is 60° and the case where the incidence angle θ is 0° is 2:1. As is shown in FIG. 18C, the protection film 39 on the sides of the MTJ element 30 is removed, and the side surfaces of the MTJ element 30 are exposed. The difference in etching rate is due to the difference in effective incidence angle of the ion beam between the protection film 39 on the side of the MTJ element 30 and the protection 39 on the lower electrode 28.

Thereby, the metallic contaminant film re-deposited on the side surfaces of the MTJ element 30 by the Ar ion beam etching at the time of formation of the MTJ element 30 can effectively be etched away, and a short-circuit occurring between, e.g. ferromagnetic layers extending over the insulation barrier layer of the MTJ element 30 can be suppressed. Moreover, the deposited insulative protection film 39 remains on the lower electrode 28. Thus, even if re-dispersed contaminant at the time of cleaning the contaminant film attached to the side surface of the MTJ element 30 by the ion beam etching or cleaning, an adverse effect due to the re-dispersed contaminant can be suppressed. In addition, since the protection film material re-dispersed due to the etching of the protection film 39 is also insulative, no problem arises even if it is re-deposited to the side surface of the MTJ element 30 at the time of the cleaning.

In the third embodiment, the taper angle θt of the formed hard mask 36 is equal to or less than the taper angle θmtj of the MTJ element 30. On the other hand, as shown in FIG. 16, when the angle dependency of the etching rate in the range of angles smaller than the incidence angle 60°, at which the etching rate of the insulation material of the protection film 39 takes a peak value, is compared to the angle dependency of the etching rate in the range of angles greater than the peak angle 60°, the degree of decrease in the etching rate is smaller in the former case. In other words, there is no great difference in etching rate between the hard mask 36 and MTJ element 30. Thus, in the step shown in FIG. 18C, it is thought that when the side surface of the MTJ element 30 is exposed, part of the side surface of the hard mask 36 is also exposed to some degree by the Ar ion etching.

However, if the angle dependency of re-deposition of the contaminant film on the side surface of the MTJ element 30 in the ion etching step for forming the MTJ element 30 is considered, the amount of re-deposition contaminant is nearly zero on the side surface of the MTJ element 30, which is located on the outside of the extension line of the side surface of the hard mask 36, that is, located in a direction of 180° or more relative to the ion beam irradiation surface of the hard mask 36. Therefore, re-deposition of contaminant from the side surface of the hard mask 36 to the side surface of the MTJ element 30 is practically ignorable.

According to the magnetic memory device manufacturing methods relating to the third embodiment and second embodiment, a contaminant film attached to the side surface of the MTJ element 30 at the time of ion etching can effectively be removed in the cleaning step. At this time, if the taper angle θmtj of the MTJ element 30 is preset at 60° or less, like the first embodiment, and the amount of attached conductive contaminant film is decreased, magnetic memory devices with less possibility of initial defects can be manufactured at a higher product yield.

The present invention is not limited to the above-described embodiments, and various modifications can be made within the scope of the present invention. For example, the protection film 39 is formed of AlOx or SiO$_2$, which are insulative materials. It is necessary, however, to select the material of the protection film 39, depending on the material of the lower electrode 28. For example, when the lower electrode 28 is formed of Ta, it is not preferable to form the protection film 39 using excessively-oxidized AlOx or ordinary SiO$_2$. If a large amount of excessively oxidized AlOx or ordinary SiO$_2$ is in contact with Ta that is easily oxidized, Ta would be oxidized. Consequently, the conductivity of the lower electrode 28 may be lost due to the oxidization of Ta, or part of metallic characteristics of the lower electrode would be lost. It is desirable, therefore, that when the lower electrode 28 is formed of Ta, the protection film 39 be formed of an insulative nitride such as oxygen-free SiNx, or an oxide of Al that is oxidized easier than Ta, in particular, of a composition free from excessive oxygen.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a magnetic memory device, comprising:

forming an insulation layer on a substrate;

forming a lower electrode on the insulation layer;

forming a magneto-resistive film on an upper surface of the lower electrode, the magneto-resistive film including an insulation barrier layer and a plurality of magnetic films stacked on both sides of the insulation barrier layer;

stacking a mask layer on the magneto-resistive film; and performing ion etching on the magneto-resistive film, using the mask layer as a mask, thereby forming a magneto-resistive element, such that a center of distribution of sputter substance dispersed by an ion beam is located away from a side surface of the magneto-resistive element, wherein at the time of the ion etching, a taper is formed on the side surface of the magneto-resistive element such that an angle of the side surface of the magneto-resistive element to a bottom surface of the magneto-resistive element is about 60° or less.

2. A method of manufacturing a magnetic memory device, comprising:

forming an insulation layer on a substrate;

forming a lower electrode on the insulation layer;

forming a magneto-resistive film on an upper surface of the lower electrode, the magneto-resistive film including an insulation barrier layer and a plurality of magnetic films stacked on both sides of the insulation barrier layer;

stacking a mask layer on the magneto-resistive film; and performing ion etching on the magneto-resistive film, using the mask layer as a mask, thereby forming a magneto-resistive element, such that a center of distribution of sputter substance dispersed by an ion beam is located away from a side surface of the magneto-resistive element, wherein an incidence angle θ of the ion beam is set to satisfy the equation, θ=θt−θm where θm is the ion beam incidence angle at which a maximum sputtering efficiency of the mask is obtained,
θt is the taper angle of a side surface of the mask, and
θ is the incidence angle of the ion beam to a normal line of the substrate.

3. The method of manufacturing a magnetic memory device, according to claim 1, wherein an incidence angle θ of the ion beam is set to satisfy the equation, θ=θt−θm where θm is the ion beam incidence angle at which a maximum sputtering efficiency of the mask is obtained,
θt is the taper angle of a side surface of the mask, and
θ is the incidence angle of the ion beam to a normal line of the substrate.

4. The method of manufacturing a magnetic memory device, according to claim 1, wherein the magneto-resistive element is formed in a self-alignment manner, relative to the mask.

5. The method of manufacturing a magnetic memory device, according to claim 1, further comprising a cleaning step of cleaning the side surface of the magneto-resistive element, after forming the magneto-resistive element by performing the ion etching on the magneto-resistive film.

6. The method of manufacturing a magnetic memory device, according to claim 5, wherein the cleaning step includes a step of applying an ion beam to the side surface of the magneto-resistive element.

7. The method of manufacturing a magnetic memory device, according to claim 1, wherein the ion etching uses argon ions.

8. The method of manufacturing a magnetic memory device, according to claim 1, wherein the ion etching is effected by RIE.

9. The method of manufacturing a magnetic memory device, according to claim 1, wherein a positional relationship between an ion source for the ion etching and the substrate is varied such that all side surfaces of the magneto-resistive element are directed to the ion source.

10. A method of manufacturing a magnetic memory device, comprising:
forming an insulation layer on a substrate;
forming a lower electrode on the insulation layer;
forming a magneto-resistive film on an upper surface of the lower electrode, the magneto-resistive film including an insulation barrier layer and a plurality of magnetic films stacked on both sides of the insulation barrier layer;
stacking a mask layer on the magneto-resistive film;
performing ion etching on the magneto-resistive film, using the mask layer as a mask, thereby forming a magneto-resistive element;
forming an insulation film on upper surfaces of the mask, the magneto-resistive element and the lower electrode; and
etching the insulation film with an ion beam such that a side surface of the magneto-resistive element is exposed.

11. A method of manufacturing a magnetic memory device, comprising:
forming an insulation layer on a substrate;
forming a lower electrode on the insulation layer;
forming a magneto-resistive film on an upper surface of the lower electrode, the magneto-resistive film including an insulation barrier layer and a plurality of magnetic films stacked on both sides of the insulation barrier layer;
stacking a mask layer on the magneto-resistive film;
performing ion etching on the magneto-resistive film, using the mask layer as a mask, thereby forming a magneto-resistive element, and also over-etching an upper part of the lower electrode, thereby forming a recess at the upper part of the lower electrode;
forming an insulation film on upper surfaces of the mask, the magneto-resistive element and the lower electrode including the recess; and
etching the insulation film with an ion beam such that a side surface of the magneto-resistive element is exposed and the insulation film remains on the lower electrode.

12. The method of manufacturing a magnetic memory device, according to claim 11, wherein the insulation film is formed of a material that is more easily oxidizable than the lower electrode.

13. The method of manufacturing a magnetic memory device, according to claim 11, wherein the insulation film is formed of an oxygen-free material.

14. The method of manufacturing a magnetic memory device, according to claim 10, wherein when the magneto-resistive element is formed, an etched substance, which is dispersed and attached at the time of the ion beam etching, is removed from the side surface of the magneto-resistive element by the ion beam.

15. The method of manufacturing a magnetic memory device, according to claim 11, wherein when the magneto-resistive element is formed, an etched substance, which is dispersed and attached at the time of the ion beam etching, is removed from the side surface of the magneto-resistive element by the ion beam.

16. The method of manufacturing a magnetic memory device, according to claim 10, wherein the following equation is satisfied:

$t=d*(ER(\theta mtj-\theta)-ER(\theta))/(ER(\theta mtj-\theta)*ER(\theta))$ where θmtj is a taper angle of the side surface of the magneto-resistive element,
ER (θmtj) is an etching rate of the magneto-resistive element as a function of θmtj,
ER(θ) is an etching rate of the insulation film formed on the magneto-resistive element as a function of an incidence angle θ of an ion beam at the time of etching,
d is the thickness of the insulation film, and
t is a time at which only the side surface of the magneto-resistive element is exposed by the ion etching.

17. The method of manufacturing a magnetic memory device, according to claim 11, wherein the following equation is satisfied:

$t=d*(ER(\theta mtj-\theta)-ER(\theta))/(ER(\theta mtj-\theta)*ER(\theta))$ where θmtj is a taper angle of the side surface of the magneto-resistive element,
ER(θmtj) is an etching rate of the magneto-resistive element as a function of θmtj,
ER(θ) is an etching rate of the insulation film formed on the magneto-resistive element as a function of an incidence angle θ of an ion beam at the time of etching,
d is the thickness of the insulation film, and
t is a time at which only the side surface of the magneto-resistive element is exposed by the ion etching.

18. The method of manufacturing a magnetic memory device, according to claim 10, wherein a taper is formed on at least the side surface of the magneto-resistive element with respect to a bottom surface of the magneto-resistive element and an incident angle of the ion beam is normal to a bottom surface of the magneto-resistive element.

19. The method of manufacturing a magneto memory device, according to claim 18, wherein the side surface of the magneto-resistive element to the bottom surface thereof is about 60° or less.

* * * * *